United States Patent
Olivadese

(10) Patent No.: US 11,290,086 B2
(45) Date of Patent: Mar. 29, 2022

(54) SUPERCONDUCTING RESONATOR DEFINITION BASED ON ONE OR MORE ATTRIBUTES OF A SUPERCONDUCTING CIRCUIT

(71) Applicant: International Business Machines Corporation, Armonk, NY (US)

(72) Inventor: Salvatore Bernardo Olivadese, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/020,017

(22) Filed: Sep. 14, 2020

(65) Prior Publication Data
US 2021/0006234 A1 Jan. 7, 2021

Related U.S. Application Data

(63) Continuation of application No. 16/390,682, filed on Apr. 22, 2019, now Pat. No. 10,833,652.

(51) Int. Cl.
*H03H 11/02* (2006.01)
*G06F 11/30* (2006.01)
(Continued)

(52) U.S. Cl.
CPC ......... *H03H 11/02* (2013.01); *G06F 11/3048* (2013.01); *G06F 11/3409* (2013.01); *H01P 7/00* (2013.01); *H03H 7/004* (2013.01)

(58) Field of Classification Search
None
See application file for complete search history.

(56) References Cited

U.S. PATENT DOCUMENTS 5,065,096 A 11/1991 Muck et al.
5,965,494 A * 10/1999 Terashima .......... H01P 1/20363
333/219
(Continued)

FOREIGN PATENT DOCUMENTS

WO 03090162 A2 10/2003
WO 2016044917 A1 3/2016
(Continued)

OTHER PUBLICATIONS

Yamamoto, et al., Superconducting flux qubit capacitively coupled to an LC resonator, New Journal of Physics, Jan. 10, 2014, 24 Pages.
(Continued)

*Primary Examiner* — Thomas J. Hiltunen
(74) *Attorney, Agent, or Firm* — Amin, Turocy & Watson, LLP

(57) ABSTRACT

Systems, computer-implemented methods, and computer program products that can facilitate superconducting resonator definition based on one or more superconducting circuit attributes, are described. According to an embodiment, a system can comprise a memory that stores computer executable components and a processor that executes the computer executable components stored in the memory. The computer executable components can comprise a resonant circuit component that derives a resonant circuit indicative of a superconducting resonator of a superconducting circuit based on one or more attributes of the superconducting circuit. The computer executable components can further comprise a resonator definition component that defines a frequency value of the superconducting resonator based on the resonant circuit.

20 Claims, 11 Drawing Sheets

(51) Int. Cl.
*G06F 11/34* (2006.01)
*H01P 7/00* (2006.01)
*H03H 7/00* (2006.01)

(56) References Cited

U.S. PATENT DOCUMENTS

| | | | |
|---|---|---|---|
| 6,960,780 | B2 | 11/2005 | Blais et al. |
| 7,449,980 | B2 * | 11/2008 | Bates .................... H01P 7/00 333/202 |
| 7,768,251 | B2 | 8/2010 | Maher |
| 9,292,642 | B2 * | 3/2016 | Herr ................... G06F 30/392 |
| 9,501,748 | B2 | 11/2016 | Bhise et al. |
| 9,625,366 | B2 * | 4/2017 | El Matbouly .......... G01N 15/06 |
| 9,841,484 | B2 | 12/2017 | Mohebbi et al. |
| 10,056,908 | B2 | 8/2018 | Rigetti et al. |
| 10,063,228 | B2 | 8/2018 | Deurloo et al. |
| 10,140,404 | B2 | 11/2018 | Rigetti et al. |
| 10,423,888 | B1 * | 9/2019 | Hertzberg ............. G06N 10/00 |
| 10,483,980 | B2 | 11/2019 | Sete et al. |
| 10,572,816 | B1 | 2/2020 | Vavilov et al. |
| 10,599,805 | B2 * | 3/2020 | Shao .................... G06F 30/33 |
| 10,833,652 | B1 * | 11/2020 | Olivadese ............ G06F 30/373 |
| 10,950,654 | B2 * | 3/2021 | Kelly .................... B82Y 10/00 |
| 2017/0228483 | A1 | 8/2017 | Rigetti |
| 2018/0225586 | A1 | 8/2018 | Chow et al. |
| 2018/0240035 | A1 | 8/2018 | Scheer et al. |
| 2018/0247974 | A1 | 8/2018 | Oliver et al. |
| 2019/0042967 | A1 | 2/2019 | Yoscovits et al. |
| 2019/0341668 | A1 | 11/2019 | White et al. |
| 2020/0027502 | A1 | 1/2020 | Berggren et al. |

FOREIGN PATENT DOCUMENTS

| | | |
|---|---|---|
| WO | 2017007446 A1 | 1/2017 |
| WO | 2018034638 A1 | 2/2018 |

OTHER PUBLICATIONS

Schuster, Circuit Quantum Electrodynamics, Thesis, May 2007, 255 Pages.

Rauch, et al., Microwave properties of YBa2Cu3O7-xthin films studied with coplanar transmission line resonators, Journal of Applied Physics, Feb. 15, 1993, pp. 1866-1872, vol. 73, No. 4.

Chang, et al., The inductance of a superconducting strip transmission line, Journal of Applied Physics, Dec. 1979, pp. 8129-8134, vol. 50. No. 12.

International Search Report and Written Opinion for International Application No. PCT/EP2020/057993 dated Jun. 25, 2020, 16 pages.

C. Bockstiegel et al: "A tunable coupler for superconducting microwave resonators using a nonlinear kineticuctance transmission line", Applied Physics Letters, vol. 108, No. 22, Jun. 3, 2016 {Jun. 3, 2016), p. 222604, XP055700917, us ISSN: 0003-6951, DOI: 10.1063/1.4953209 the whole document.

Office Action for U.S. Appl. No. 16/390,682 dated Mar. 19, 2020, 20 pages.

Notice of Allowance for U.S. Appl. No. 16/390,682 dated Aug. 19, 2020, 21 pages.

List of IBM Patents or Applications Treated as Related.

* cited by examiner

| Superconducting Resonator Identification No. ⟵ 702 | Measured Frequency (GHz) ⟵ 704 | Simulation Frequency Error (MHz) ⟵ 706 | LC Model Frequency Error (MHz) ⟵ 708 |
|---|---|---|---|
| 1 | 6.901326226 | 103 | 4 |
| 2 | 6.975234555 | 104 | 13.5 |
| 3 | 6.922154549 | 102 | 14 |
| 4 | 6.956312375 | 115 | 7 |

FIG. 7

SUPERCONDUCTING RESONATOR DEFINITION BASED ON ONE OR MORE ATTRIBUTES OF A SUPERCONDUCTING CIRCUIT

BACKGROUND

The subject disclosure relates to superconducting resonators, and more specifically, to superconducting resonator definition based on one or more superconducting circuit attributes.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, and/or computer program products that can facilitate superconducting resonator definition based on one or more superconducting circuit attributes are described.

According to an embodiment, a system can comprise a memory that stores computer executable components and a processor that executes the computer executable components stored in the memory. The computer executable components can comprise a resonant circuit component that derives a resonant circuit indicative of a superconducting resonator of a superconducting circuit based on one or more attributes of the superconducting circuit. The computer executable components can further comprise a resonator definition component that defines a frequency value of the superconducting resonator based on the resonant circuit.

According to another embodiment, a computer-implemented method can comprise deriving, by a system operatively coupled to a processor, a resonant circuit indicative of a superconducting resonator of a superconducting circuit based on one or more attributes of the superconducting circuit. The computer-implemented method can further comprise defining, by the system, a frequency value of the superconducting resonator based on the resonant circuit.

According to another embodiment, a computer program product that can facilitate superconducting resonator definition based on one or more superconducting circuit attributes. The computer program product can comprise a computer readable storage medium having program instructions embodied therewith, the program instructions can be executable by a processor to cause the processor to derive, by the processor, a resonant circuit indicative of a superconducting resonator of a superconducting circuit based on one or more attributes of the superconducting circuit. The program instructions can be further executable by the processor to cause the processor to define, by the processor, a frequency value of the superconducting resonator based on the resonant circuit.

According to an embodiment, a system can comprise a memory that stores computer executable components and a processor that executes the computer executable components stored in the memory. The computer executable components can comprise a circuit effect component that determines a kinetic inductance value of a superconducting circuit. The computer executable components can further comprise a resonator definition component that defines one or more parameters of a superconducting resonator based on the kinetic inductance value.

According to another embodiment, a computer-implemented method can comprise determining, by a system operatively coupled to a processor, a kinetic inductance value of a superconducting circuit. The computer-implemented method can further comprise defining, by the system, one or more parameters of a superconducting resonator based on the kinetic inductance value.

DESCRIPTION OF THE DRAWINGS

FIG. 7 illustrates an example, non-limiting table that can facilitate superconducting resonator definition based on one or more superconducting circuit attributes in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

Quantum computing is generally the use of quantum-mechanical phenomena for the purpose of performing computing and information processing functions. Quantum computing can be viewed in contrast to classical computing, which generally operates on binary values with transistors. That is, while classical computers can operate on bit values that are either 0 or 1, quantum computers operate on quantum bits that comprise superpositions of both 0 and 1, can entangle multiple quantum bits (qubits), and use interference.

Universal Quantum computers require a large number of physical qubits (e.g., millions), and for each qubit, one or more readout resonators and/or bus resonators are needed. Resonators are implemented using transmission lines. Time and effort to design and/or simulate superconducting resonators with proper accuracy grows rapidly.

Figure 1:
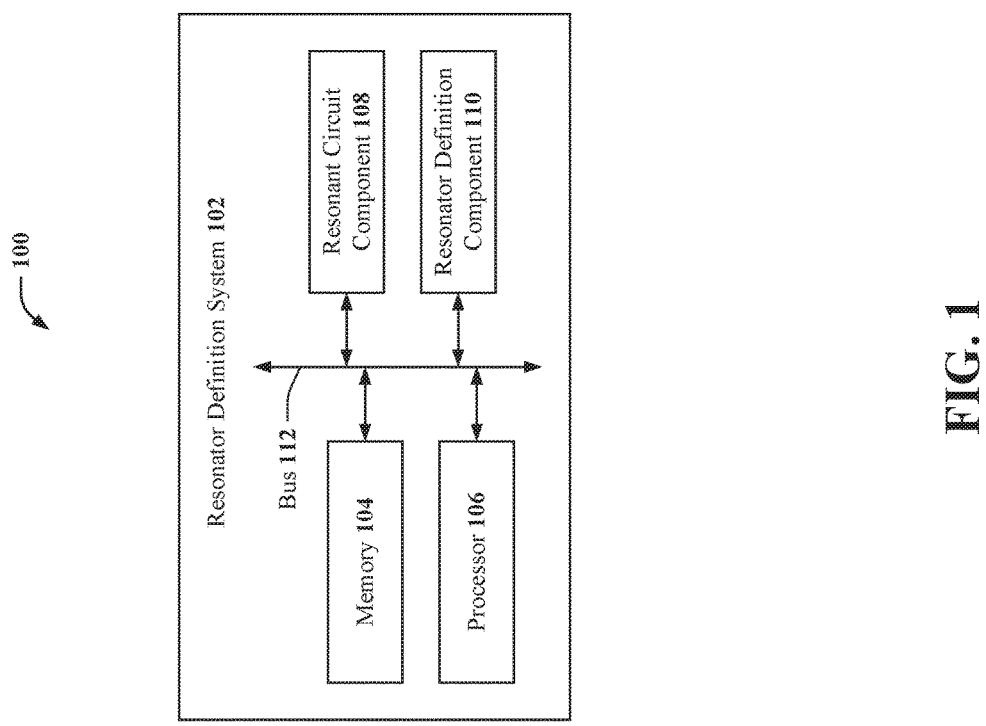
FIG. 1 illustrates a block diagram of an example, non-limiting system that can facilitate superconducting resonator definition based on one or more superconducting circuit attributes in accordance with one or more embodiments described herein.

FIG. 1 illustrates a block diagram of an example, non-limiting system 100 that can facilitate superconducting resonator definition based on one or more superconducting circuit attributes in accordance with one or more embodiments described herein. According to several embodiments, system 100 can comprise a resonator definition system 102. In some embodiments, resonator definition system 102 can comprise a memory 104, a processor 106, a resonant circuit component 108, a resonator definition component 110, and/or a bus 112.

It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100 and/or resonator definition system 102 can further comprise various computer and/or computing-based elements described herein with reference to operating environment 1000 and FIG. 10. In several embodiments, such computer and/or computing-based elements can be used in connection with implementing one or more of the systems, devices, components, and/or computer-implemented operations shown and described in connection with FIG. 1 or other figures disclosed herein.

According to multiple embodiments, memory 104 can store one or more computer and/or machine readable, writable, and/or executable components and/or instructions that, when executed by processor 106, can facilitate performance of operations defined by the executable component(s) and/or instruction(s). For example, memory 104 can store computer and/or machine readable, writable, and/or executable components and/or instructions that, when executed by processor 106, can facilitate execution of the various functions described herein relating to resonator definition system 102, resonant circuit component 108, resonator definition component 110, and/or another component associated with system 100 and/or resonator definition system 102, as described herein with or without reference to the various figures of the subject disclosure.

In some embodiments, memory 104 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Further examples of memory 104 are described below with reference to system memory 1016 and FIG. 10. Such examples of memory 104 can be employed to implement any embodiments of the subject disclosure.

According to multiple embodiments, processor 106 can comprise one or more types of processors and/or electronic circuitry that can implement one or more computer and/or machine readable, writable, and/or executable components and/or instructions that can be stored on memory 104. For example, processor 106 can perform various operations that can be specified by such computer and/or machine readable, writable, and/or executable components and/or instructions including, but not limited to, logic, control, input/output (I/O), arithmetic, and/or the like. In some embodiments, processor 106 can comprise one or more central processing unit, multi-core processor, microprocessor, dual microprocessors, microcontroller, System on a Chip (SOC), array processor, vector processor, and/or another type of processor. Further examples of processor 106 are described below with reference to processing unit 1014 and FIG. 10. Such examples of processor 106 can be employed to implement any embodiments of the subject disclosure.

In some embodiments, resonator definition system 102, memory 104, processor 106, resonant circuit component 108, resonator definition component 110, and/or another component of resonator definition system 102 as described herein can be communicatively, electrically, and/or operatively coupled to one another via a bus 112 to perform functions of system 100, resonator definition system 102, and/or any components coupled therewith. In several embodiments, bus 112 can comprise one or more memory bus, memory controller, peripheral bus, external bus, local bus, and/or another type of bus that can employ various bus architectures. Further examples of bus 112 are described below with reference to system bus 1018 and FIG. 10. Such examples of bus 112 can be employed to implement any embodiments of the subject disclosure.

In some embodiments, resonator definition system 102 can comprise any type of component, machine, device, facility, apparatus, and/or instrument that comprises a processor and/or can be capable of effective and/or operative communication with a wired and/or wireless network. All such embodiments are envisioned. For example, resonator definition system 102 can comprise a server device, a computing device, a general-purpose computer, a special-purpose computer, a quantum computing device (e.g., a quantum computer, a quantum processor, etc.), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

In some embodiments, resonator definition system 102 can be coupled (e.g., communicatively, electrically, operatively, etc.) to one or more external systems, sources, and/or devices (e.g., computing devices, communication devices, etc.) via a data cable (e.g., coaxial cable, High-Definition Multimedia Interface (HDMI), recommended standard (RS)

232, Ethernet cable, etc.). In some embodiments, resonator definition system 102 can be coupled (e.g., communicatively, electrically, operatively, etc.) to one or more external systems, sources, and/or devices (e.g., computing devices, communication devices, etc.) via a network.

According to multiple embodiments, such a network can comprise wired and wireless networks, including, but not limited to, a cellular network, a wide area network (WAN) (e.g., the Internet) or a local area network (LAN). For example, resonator definition system 102 can communicate with one or more external systems, sources, and/or devices, for instance, computing devices (and vice versa) using virtually any desired wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. In such an example, resonator definition system 102 can thus include hardware (e.g., a central processing unit (CPU), a transceiver, a decoder), software (e.g., a set of threads, a set of processes, software in execution) or a combination of hardware and software that facilitates communicating information between resonator definition system 102 and external systems, sources, and/or devices (e.g., computing devices, communication devices, etc.).

According to multiple embodiments, resonator definition system 102 can comprise one or more computer and/or machine readable, writable, and/or executable components and/or instructions that, when executed by processor 106, can facilitate performance of operations defined by such component(s) and/or instruction(s). Further, in numerous embodiments, any component associated with resonator definition system 102, as described herein with or without reference to the various figures of the subject disclosure, can comprise one or more computer and/or machine readable, writable, and/or executable components and/or instructions that, when executed by processor 106, can facilitate performance of operations defined by such component(s) and/or instruction(s). For example, resonant circuit component 108, resonator definition component 110, and/or any other components associated with resonator definition system 102 as disclosed herein (e.g., communicatively, electronically, and/or operatively coupled with and/or employed by resonator definition system 102), can comprise such computer and/or machine readable, writable, and/or executable component(s) and/or instruction(s). Consequently, according to numerous embodiments, resonator definition system 102 and/or any components associated therewith as disclosed herein, can employ processor 106 to execute such computer and/or machine readable, writable, and/or executable component(s) and/or instruction(s) to facilitate performance of one or more operations described herein with reference to resonator definition system 102 and/or any such components associated therewith.

In some embodiments, resonator definition system 102 can facilitate (e.g., via processor 106) performance of operations executed by and/or associated with resonant circuit component 108, resonator definition component 110, and/or another component associated with resonator definition system 102 as disclosed herein. For example, as described in detail below, resonator definition system 102 can facilitate: deriving a resonant circuit indicative of a superconducting resonator of a superconducting circuit based on one or more attributes of the superconducting circuit; and/or defining a frequency value of the superconducting resonator based on the resonant circuit. In some embodiments, resonator definition system 102 can further facilitate: defining a length value of the superconducting resonator based on the resonant circuit; deriving the resonant circuit based on at least one of a kinetic inductance value of a material of the superconducting circuit or a capacitive coupling value of a qubit capacitively coupled to at least one of the resonant circuit, the superconducting resonator, or a ground; deriving the resonant circuit based on a total capacitive coupling value comprising a capacitive coupling value of the resonant circuit and one or more capacitive coupling values of one or more qubits capacitively coupled to at least one of the resonant circuit, the superconducting resonator, or a ground; deriving the resonant circuit based on a total inductance value comprising an inductance value of the resonant circuit and one or more kinetic inductance values of one or more materials of the superconducting circuit; and/or deriving the resonant circuit based on a defined frequency value of the superconducting resonator or a defined length value of the superconducting resonator. In some embodiments, resonator definition system 102 can further facilitate: determining a kinetic inductance value of a superconducting circuit; and/or defining one or more parameters of a superconducting resonator based on the kinetic inductance value. In some embodiments, resonator definition system 102 can further facilitate defining at least one of a frequency value of the superconducting resonator or a length value of the superconducting resonator based on at least one of the kinetic inductance value or a capacitive coupling value of a qubit capacitively coupled to at least one of the superconducting circuit, the superconducting resonator, or a ground.

According to multiple embodiments, resonant circuit component 108 can derive a resonant circuit indicative of a superconducting resonator of a superconducting circuit based on one or more attributes of the superconducting circuit. For example, in some embodiments, resonant circuit component 108 can derive a resonant circuit such as, for instance, a quantum inductor capacitor circuit (also referred to herein and/or denoted in the figures as an LC circuit, an LC model, a quantum LC circuit, a quantum LC model, a tank circuit, a tuned circuit, etc.). As referenced herein, a resonant circuit can comprise an inductor (L) coupled (e.g., electrically) to a capacitor (C) and a ground, where such a resonant circuit can operate as an electrical resonator, storing energy that oscillates at the resonant frequency of the resonant circuit. For example, the capacitor (C) can store energy in an electric field present between the plates of such capacitor (C) and the inductor (L) can store energy in a magnetic field surrounding such an inductor (L).

In some embodiments, resonant circuit component 108 can derive (e.g., generate) a resonant circuit indicative of (e.g., representative of and/or that can simulate) a superconducting resonator of a superconducting circuit. For example, resonant circuit component 108 can derive a resonant circuit (e.g., an LC model, a quantum LC model, etc.) that can represent one or more parameters (e.g., frequency, length, etc.) of a superconducting resonator (e.g., a transmission line) implemented in a superconducting circuit (e.g., a circuit quantum electrodynamics (circuit QED)). In another example, resonant circuit component 108 can derive a resonant circuit (e.g., an LC model, a quantum LC model, etc.) that can simulate operation of a superconducting resonator (e.g., a transmission line) implemented in a superconducting circuit (e.g., a circuit quantum electrodynamics (circuit QED)).

In some embodiments, resonator definition system 102 can generate an electrical circuit that can constitute a model of a superconducting circuit. For example, resonator definition system 102 can generate circuit 300a, circuit 300b, and/or circuit 400 described below and illustrated in FIGS. 3 and 4, respectively, where such circuits can comprise electrical circuits that can constitute models of superconducting circuits.

Figure 3A:
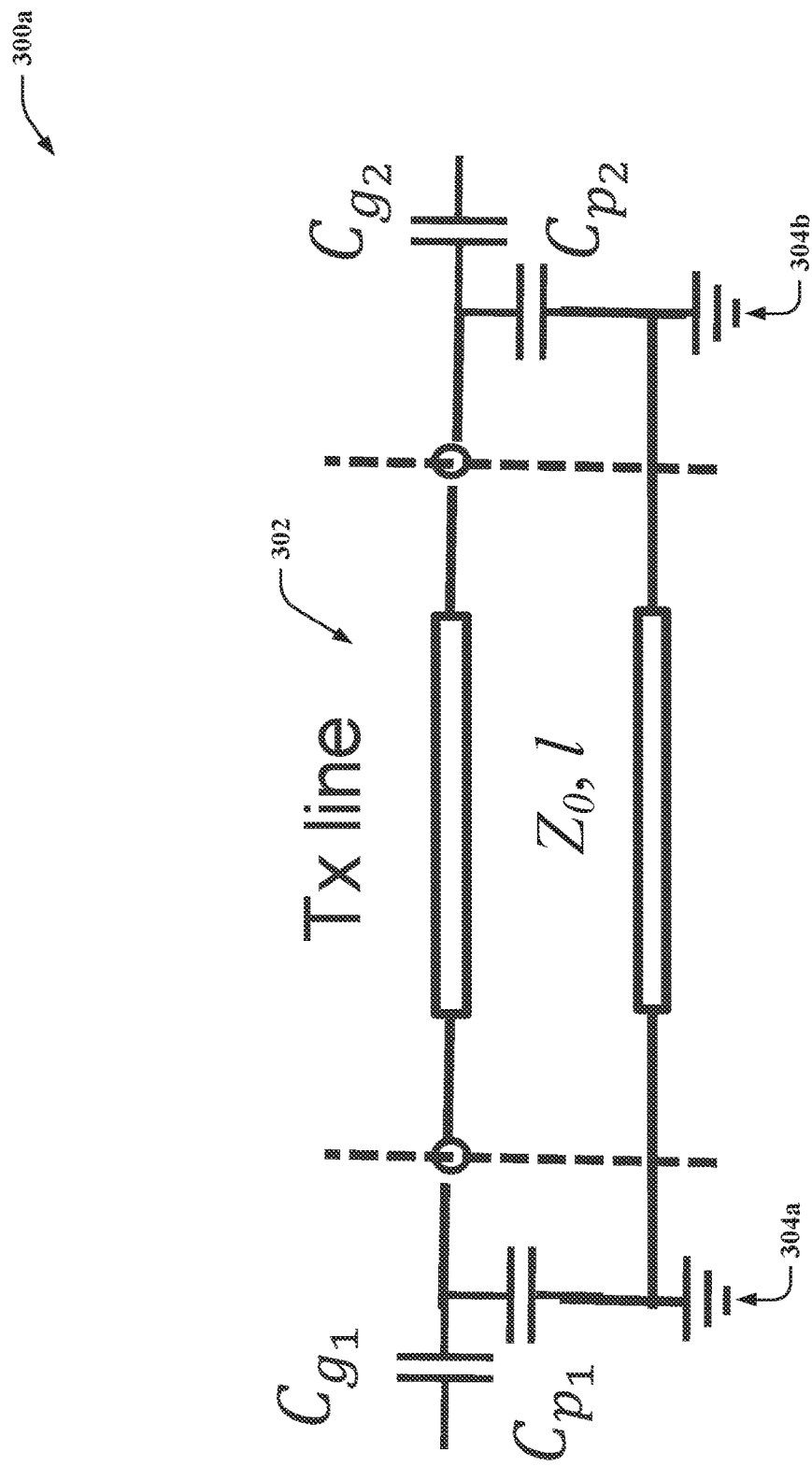
FIGS. 3A and 3B illustrate example, non-limiting circuits that can facilitate superconducting resonator definition based on one or more superconducting circuit attributes in accordance with one or more embodiments described herein.
Figure 3B:
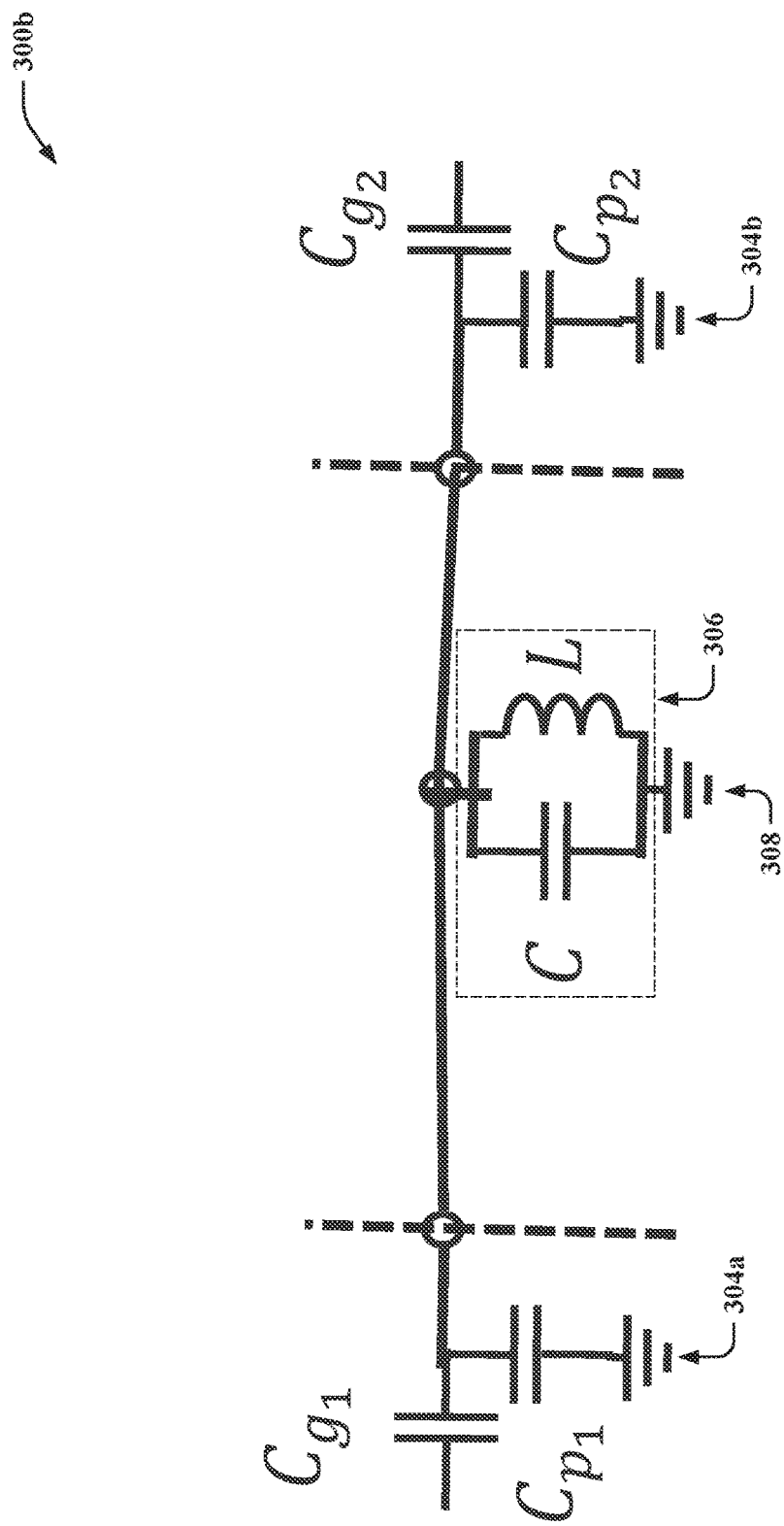

FIGS. 3A and 3B illustrate example, non-limiting circuits 300a, 300b that can facilitate superconducting resonator definition based on one or more superconducting circuit attributes in accordance with one or more embodiments described herein. Repetitive description of like elements and/or processes employed in respective embodiments is omitted for sake of brevity. In some embodiments, as described above, circuit 300a and/or circuit 300b can comprise electrical circuits that can constitute models of superconducting circuits.

According to multiple embodiments, circuit 300a (FIG. 3A) can comprise a superconducting circuit having a superconducting resonator that can be modeled (e.g., by resonator definition system 102) as a transmission line 302. In some embodiments, transmission line 302 can comprise a length value (l), a frequency value (f), and/or an impedance ($Z_0$) that can be defined by an entity (e.g., by a human using a graphical user interface (GUI) of resonator definition system 102, not illustrated in the figures). In some embodiments, transmission line 302 can be capacitively coupled to one or more qubits, where such capacitive coupling of each qubit can be modeled (e.g., by resonator definition system 102) as two capacitors, one in series (e.g., denoted as $Cg_1$ and $Cg_2$ in FIGS. 3A and 3B) and one in parallel (e.g., denoted as $Cp_1$ and $Cp_2$ in FIGS. 3A and 3B) between transmission line 302 and one or more grounds 304a, 304b, as illustrated in FIGS. 3A and 3B. In some embodiments, such capacitive coupling of each qubit that can be represented by capacitors $Cg_1$, $Cg_2$, $Cp_1$, and $Cp_2$ can comprise discrete capacitive coupling values respectively corresponding to capacitors $Cg_1$, $Cg_2$, $Cp_1$, and $Cp_2$, where such capacitive coupling values are also denoted herein as $Cg_1$, $Cg_2$, $Cp_1$, and $Cp_2$, respectively.

According to multiple embodiments, circuit 300b (FIG. 3B) can comprise a superconducting circuit having a superconducting resonator that can be modeled (e.g., by resonator definition system 102 and/or resonant circuit component 108) as a resonant circuit 306. For example, resonant circuit component 108 can derive resonant circuit 306, where resonant circuit 306 can comprise a model (e.g., a representation) of transmission line 302 described above and illustrated in FIG. 3A. In some embodiments, resonant circuit 306 can comprise a capacitor (e.g., denoted as C in FIG. 3B) and an inductor (e.g., denoted as L in FIG. 3B). In some embodiments, capacitor C can comprise a capacitive coupling value corresponding thereto that is also denoted herein as C and inductor L can have an inductance value corresponding thereto that is also denoted herein as L.

In some embodiments, resonant circuit component 108 can derive a resonant circuit based on a defined frequency value of a superconducting resonator. For example, by employing equations (1) and (2) defined below, resonant circuit component 108 can derive resonant circuit 306 based on a frequency value f of a superconducting resonator (e.g., transmission line 302) that can be defined by an entity (e.g., a human using a GUI of resonator definition system 102 as described above). In another example, by employing equation (3) defined below, resonant circuit component 108 can calculate a length value l of a superconducting resonator (e.g., transmission line 302) based on a frequency value f of such a superconducting resonator that can be defined by an entity (e.g., a human using a GUI of resonator definition system 102 as described above).

$$C = \frac{1}{4fZ_0} \tag{1}$$

$$L = \frac{1}{4\pi^2 f^2 C} \tag{2}$$

$$l = \frac{c}{2f\sqrt{\epsilon_{r_{eff}}}} \tag{3}$$

where:

C denotes the capacitive coupling value of resonant circuit 306 (e.g., the equivalent capacitance);

f denotes a frequency value of a superconducting resonator that can comprise transmission line 302 and/or can be modeled (e.g., by resonator definition system 102 and/or resonant circuit component 108) as resonant circuit 306;

$Z_0$ denotes a line impedance value (e.g., an impedance value of transmission line 302);

c denotes the speed of light;

l denotes a length value of a superconducting resonator that can comprise transmission line 302, and therefore, l can denote a length value of transmission line 302; and $\epsilon_{r_{eff}}$ denotes an effective dielectric constant of a dielectric substrate that can be used to fabricate a superconducting resonator comprising transmission line 302.

Additionally, or alternatively, in some embodiments, resonant circuit component 108 can derive a resonant circuit based on a defined length value of a superconducting resonator. For example, by employing equations (4), (5), and (6) defined below, resonant circuit component 108 can derive resonant circuit 306 based on a length value l of a superconducting resonator (e.g., transmission line 302) that can be defined by an entity (e.g., a human using a GUI of resonator definition system 102 as described above).

$$f_{\lambda/2} = \frac{c}{2l\sqrt{\epsilon_{r_{eff}}}} \tag{4}$$

$$C = \frac{1}{4f_{\lambda/2}Z_0} \tag{5}$$

$$L = \frac{1}{4\pi^2 f_{\lambda/2}^2 C} \tag{6}$$

where $f_{\lambda/2}$ denotes a frequency value of a superconducting resonator that can comprise transmission line 302 and/or can be modeled (e.g., by resonator definition system 102 and/or resonant circuit component 108) as resonant circuit 306.

In some embodiments, resonant circuit 306 can be capacitively coupled to one or more qubits, where such capacitive coupling of each qubit can be modeled (e.g., by resonator definition system 102) as two capacitors, one in series (e.g., denoted as $Cg_1$ and $Cg_2$ in FIGS. 3A and 3B) and one in parallel (e.g., denoted as $Cp_1$ and $Cp_2$ in FIGS. 3A and 3B) between transmission line 302 and one or more grounds 304a, 304b, as illustrated in FIGS. 3A and 3B. In some embodiments, resonant circuit 306 can be further coupled (e.g., electrically) to a ground 308, as illustrated in FIG. 3B. In some embodiments, resonant circuit 306 can be capacitively coupled to a single qubit (e.g., which can be represented by capacitors $Cg_1$ and $Cp_1$ or capacitors $Cg_2$ and $Cp_2$) and a capacitor (not illustrated in the figures) to facilitate readout of such a qubit.

In some embodiments, resonant circuit component 108 can derive a resonant circuit indicative of (e.g., representative of and/or that can simulate) a superconducting resonator including, but not limited to, a single mode superconducting resonator, a single mode qubit bus resonator, a single mode qubit transmission line resonator, a single mode transmission line superconducting resonator, and/or another superconducting resonator. For example, resonant circuit component 108 can derive resonant circuit 306 and/or resonant circuit 402 described below with reference to FIG. 4, where resonant circuit 306 and/or resonant circuit 402 can each be indicative of a single mode superconducting resonator comprising a single mode (e.g., single frequency) near a qubit frequency. For instance, resonant circuit 306 and/or resonant circuit 402 can each comprise a representation (e.g., a model) of a single mode superconducting resonator that can operate at a single frequency (e.g., can generate and/or identify a signal at a certain frequency) that is approximately equivalent to the frequency of one or more qubits coupled to resonant circuit 306 and/or resonant circuit 402.

Returning to FIG. 1, in some embodiments, resonant circuit component 108 can derive a resonant circuit indicative of a superconducting resonator of a superconducting circuit based on one or more attributes of the superconducting circuit, where such one or more attributes of the superconducting circuit can include, but are not limited to, a kinetic inductance value of the superconducting circuit, a capacitive coupling value(s) of one or more qubits of the superconducting circuit, and/or another attribute of the superconducting circuit. For example, resonant circuit component 108 can derive a resonant circuit based on one or more kinetic inductance values of one or more materials (e.g., dielectric substrate(s), metal(s), superconducting metal(s), etc.) of a superconducting circuit and/or one or more capacitive coupling values of one or more qubits of such a superconducting circuit (e.g., capacitive coupling value(s) of one or more qubits capacitively coupled to the resonant circuit, the superconducting resonator, and/or a ground).

As referenced herein, kinetic inductance can comprise an equivalent series inductance representing the inertial mass of mobile charge carriers in alternative electric fields, where such kinetic inductance can comprise an additional inductive component of a superconducting resonator (e.g., a transmission line such as, for instance, transmission line 302) that can change the frequency of such a superconducting resonator. In some embodiments, as such kinetic inductance of a material (e.g., a dielectric substrate, a superconducting metal, etc.) used to fabricate a superconducting resonator can change the frequency of such a superconducting resonator, resonant circuit component 108 can derive a resonant circuit that can account for such a change in the frequency of such a superconducting resonator. For example, as described below and illustrated in FIG. 4, resonant circuit component 108 can derive a resonant circuit (e.g., resonant circuit 402) that can account for such a change in the frequency of such a superconducting resonator. For instance, resonant circuit component 108 can derive resonant circuit 402 described below and illustrated in FIG. 4, where resonant circuit component 108 can derive resonant circuit 402 based on a kinetic inductance value of a material (e.g., a dielectric substrate, a metal, etc.) that can be used to fabricate transmission line 302 and/or one or more capacitive coupling values of one or more qubits of circuit 300a and/or circuit 300b (e.g., capacitive coupling values of capacitors $Cp_1$ and $Cp_2$ illustrated in FIGS. 3A and 3B).

Figure 4:
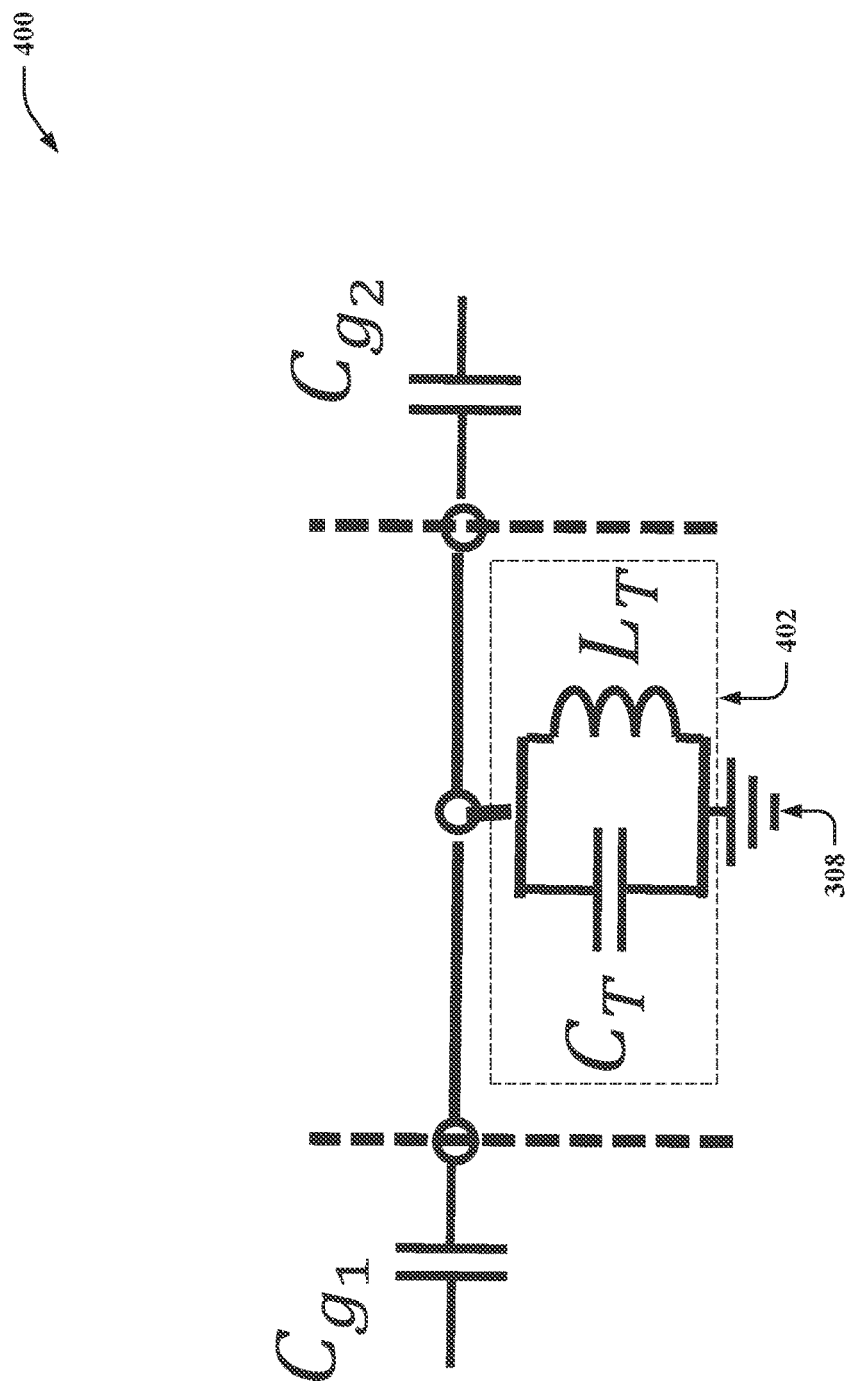
FIG. 4 illustrates an example, non-limiting circuit that can facilitate superconducting resonator definition based on one or more superconducting circuit attributes in accordance with one or more embodiments described herein.

FIG. 4 illustrates an example, non-limiting circuit 400 that can facilitate superconducting resonator definition based on one or more superconducting circuit attributes in accordance with one or more embodiments described herein. Repetitive description of like elements and/or processes employed in respective embodiments is omitted for sake of brevity. In some embodiments, as described above, circuit 400 can comprise an electrical circuit that can constitute a model of a superconducting circuit.

According to multiple embodiments, circuit 400 can comprise a superconducting circuit having a superconducting resonator that can be modeled (e.g., by resonator definition system 102 and/or resonant circuit component 108) as a resonant circuit 402. In some embodiments, similar to resonant circuit 306 described above with reference to FIG. 3B, resonant circuit component 108 can derive resonant circuit 402 based on a defined frequency value of a superconducting resonator or a defined length value of a superconducting resonator. For example, resonant circuit component 108 can employ equations (1) and (2) defined above to derive resonant circuit 402 based on a frequency value f of a superconducting resonator (e.g., transmission line 302) that can be defined by an entity (e.g., a human using a GUI of resonator definition system 102 as described above). In another example, resonant circuit component 108 can employ equations (4), (5), and (6) defined above to derive resonant circuit 402 based on a length value l of a superconducting resonator (e.g., transmission line 302) that can be defined by an entity (e.g., a human using a GUI of resonator definition system 102 as described above). Additionally, or alternatively, in some embodiments, as described above, resonant circuit component 108 can derive resonant circuit 402 based on a kinetic inductance value of a material (e.g., a dielectric substrate, a superconducting metal, etc.) that can be used to fabricate transmission line 302 and/or one or more capacitive coupling values of one or more qubits of circuit 300a and/or circuit 300b (e.g., capacitive coupling values of capacitors $Cp_1$ and $Cp_2$ illustrated in FIGS. 3A and 3B).

In some embodiments, resonant circuit component 108 can derive resonant circuit 402 based on a total capacitive coupling value of resonant circuit 402 (e.g., denoted as $C_T$ in FIG. 4) and/or a total inductance value of resonant circuit 402 (e.g., denoted as $L_T$ in FIG. 4). In some embodiments, such a total capacitive coupling value $C_T$ of resonant circuit 402 can comprise a capacitive coupling value of capacitor C of resonant circuit 306 (e.g., the equivalent capacitance) and capacitive coupling values of one or more capacitors $Cp_1$ and $Cp_2$ of circuit 300a and/or circuit 300b. In some embodiments, such total inductance value $L_T$ of resonant circuit 402 can comprise an inductance value of inductor L of resonant circuit 306 (e.g., the equivalent inductance) and a kinetic inductance value of a material (e.g., a dielectric substrate, a superconducting metal, etc.) used to fabricate, for example, transmission line 302.

In some embodiments, to derive resonant circuit 402 based on such a total capacitive coupling value $C_T$ of resonant circuit 402, resonant circuit component 108 can employ equations (7) or (8) defined below to calculate such a total capacitive coupling value $C_T$ of resonant circuit 402. In some embodiments, for example, where a length value l of a superconducting resonator (e.g., transmission line 302) is defined by an entity (e.g., a human using a GUI of resonator definition system 102 as described above), resonant circuit component 108 can employ equations (4) and (5) defined above and equation (7) defined below to calculate such a total capacitive coupling value $C_T$ of resonant circuit 402. In some embodiments, for example, where a frequency value f of a superconducting resonator (e.g., transmission line 302) is defined by an entity (e.g., a human using a GUI of resonator definition system 102 as described above), resonant circuit component 108 can employ equation (1) defined above and equation (8) defined below to calculate such a total capacitive coupling value $C_T$ of resonant circuit 402.

$$C_T = C + C_{p1} + C_{p2} \quad (7)$$

$$C_T = C - C_{p1} - C_{p2} \quad (8)$$

where:

$C_T$ denotes the total capacitive coupling value of resonant circuit 402;

C denotes the capacitive coupling value of resonant circuit 306 (e.g., the equivalent capacitance), which can be calculated (e.g., by resonant circuit component 108) based on a defined length value l using equations (4) and (5) defined above or based on a defined frequency value f using equation (1) defined above; and $C_{p1}$ and $C_{p2}$ denote the capacitive coupling values of capacitors $C_{p1}$ and $C_{p2}$ that can represent two (2) qubits capacitively coupled to resonant circuit 306, the superconducting resonator (e.g., transmission line 302), and/or a ground (e.g., grounds 304a, 304b illustrated in FIG. 3).

In some embodiments, such capacitive coupling values of capacitors $C_{p1}$ and $C_{p2}$ can be predetermined and/or input to resonator definition system 102. For example, such capacitive coupling values of capacitors $C_{p1}$ and $C_{p2}$ can be predetermined by simulating such qubits and/or superconducting circuit using a simulation component (e.g., a simulation application such as, for instance, electromagnetic simulation software, an electromagnetic field solver application, etc.) of, for instance, resonator definition system 102 (not illustrated in the figures). In another example, such capacitive coupling values of capacitors $C_{p1}$ and $C_{p2}$ can be input to resonator definition system 102 by an entity (e.g., a human using a GUI of resonator definition system 102 as described above).

In some embodiments, to derive resonant circuit 402 based on such a total inductance value $L_T$ of resonant circuit 402, resonant circuit component 108 can employ equations (9) or (10) defined below to calculate such a total inductance value $L_T$ of resonant circuit 402. In some embodiments, for example, where a length value l of a superconducting resonator (e.g., transmission line 302) is defined by an entity (e.g., a human using a GUI of resonator definition system 102 as described above), resonant circuit component 108 can employ equations (4), (5), and (6) defined above and equation (9) defined below to calculate such a total inductance value $L_T$ of resonant circuit 402. In some embodiments, for example, where a frequency value f of a superconducting resonator (e.g., transmission line 302) is defined by an entity (e.g., a human using a GUI of resonator definition system 102 as described above), resonant circuit component 108 can employ equations (1) and (2) defined above and equation (10) defined below to calculate such a total inductance value $L_T$ of resonant circuit 402.

$$L_T = L + L_{kin} \quad (9)$$

$$L_T = L - L_{kin} \quad (10)$$

where:

$L_T$ denotes the total inductance value of resonant circuit 402;

L denotes the inductance value of resonant circuit 306 (e.g., the equivalent inductance), which can be calculated (e.g., by resonant circuit component 108) based on a defined length value l using equations (4), (5), and (6) defined above or based on a defined frequency value f using equations (1) and (2) defined above; and;

$L_{kin}$ denotes the kinetic inductance value of a material (e.g., a dielectric substrate, a metal, a superconducting metal, etc.) that can be used to fabricate the superconducting resonator (e.g., transmission line 302).

In some embodiments, to determine the kinetic inductance value $L_{kin}$ defined above, resonant circuit component 108 can employ circuit effect component 202. For example, resonant circuit component 108 can employ circuit effect component 202 to calculate such a kinetic inductance value $L_{kin}$ using equation (11) as described below with reference to FIG. 2.

Figure 2:
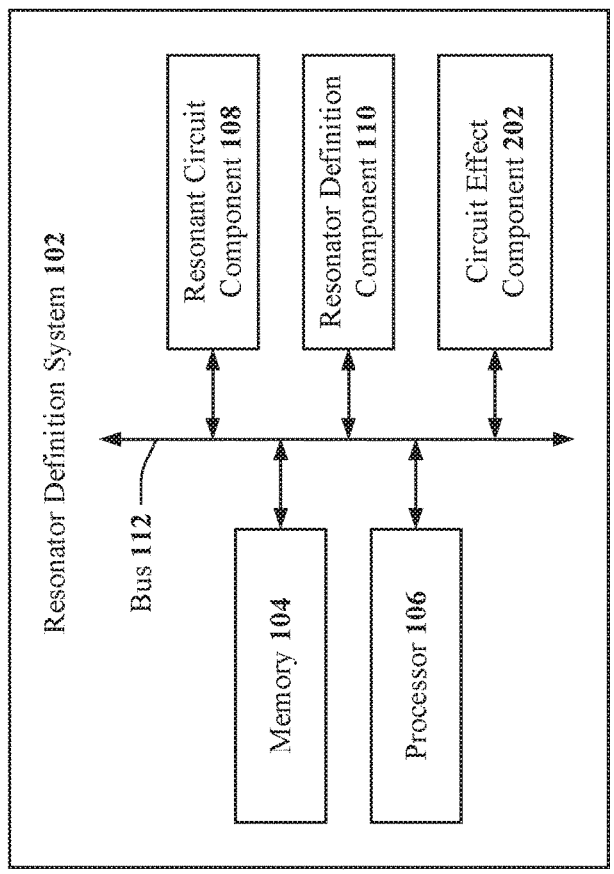
FIG. 2 illustrates a block diagram of an example, non-limiting system that can facilitate superconducting resonator definition based on one or more superconducting circuit attributes in accordance with one or more embodiments described herein.

FIG. 2 illustrates a block diagram of an example, non-limiting system 200 that can facilitate superconducting resonator definition based on one or more superconducting circuit attributes in accordance with one or more embodiments described herein. Repetitive description of like elements and/or processes employed in respective embodiments is omitted for sake of brevity. In some embodiments, system 200 can comprise resonator definition system 102, which can comprise a circuit effect component 202.

According to multiple embodiments, circuit effect component 202 can determine a kinetic inductance value of a superconducting circuit. For example, circuit effect component 202 can determine the kinetic inductance value $L_{kin}$ defined above with reference to FIG. 4, where such kinetic inductance value $L_{kin}$ can comprise the kinetic inductance value of a material (e.g., a dielectric substrate, a metal, a superconducting metal, etc.) that can be used to fabricate transmission line 302.

In some embodiments, circuit effect component 202 can calculate such kinetic inductance value $L_{kin}$ using equation (11) defined below.

$$L'_{kin} = \mu_0 \lambda_L \frac{C}{4ADK(k)} \left( \frac{1.7}{\sinh[t/(2\lambda_L)]} + \frac{0.4}{\sqrt{[(B/A)^2 - 1][1 - (B/D)^2]}} \right) \quad (11)$$

where terms A, B, C, and D of equation (11) are defined below, and where term C does not denote capacitor C and thus, should not be confused with capacitor C described above with reference to FIG. 3B:

$$A = -\frac{t}{\pi} + \frac{1}{2}\sqrt{\left(\frac{2t}{\pi}\right)^2 + \omega^2},$$

-continued $$B = \frac{\omega^2}{4A},$$

$$C = B - \frac{t}{\pi} + \sqrt{\left(\frac{t}{\pi}\right)^2 + \frac{1}{4}(d-\omega)^2},$$

$$D = \frac{2t}{\pi} + C.$$

$\mu_0$ denotes a magnetic permeability;

$\lambda_L$ denotes a magnetic penetration depth;

K(k) denotes a complete elliptic integral of the first kind;

h denotes a height of a substrate (e.g., a dielectric substrate) upon which transmission line 302 can be formed;

t denotes a thickness of transmission line 302;

d denotes a spacing distance of transmission line 302;

w denotes a width of transmission line 302;

Returning to FIG. 1, according to multiple embodiments, resonator definition component 110 can define one or more parameters of a superconducting resonator based on a resonant circuit. For example, resonator definition component 110 can define one or more parameters of a superconducting resonator including, but not limited to, a frequency value, a length value, and/or another parameter based on a resonant circuit. For instance, resonator definition component 110 can define such one or more parameters of a superconducting resonator based on resonant circuit 306 and/or resonant circuit 402 described above with reference to FIGS. 3B and 4, where resonant circuit 306 and/or resonant circuit 402 can comprise electrical circuit representations of such a superconducting resonator (e.g., electrical circuit representations of transmission line 302).

In some embodiments, resonator definition component 110 can define a frequency value of a superconducting resonator based on resonant circuit 306, where resonant circuit 306 can comprise an electrical circuit representation of such a superconducting resonator. For example, to define such a frequency value of such a superconducting resonator based on resonant circuit 306, resonator definition component 110 can calculate a frequency value of resonant circuit 306 using equation (12) defined below.

$$f_{LC} = \frac{1}{2\pi\sqrt{LC}} \tag{12}$$

where $f_{LC}$ denotes a frequency value of resonant circuit 306 and as resonant circuit 306 can comprise an electrical circuit representation of a superconducting resonator, $f_{LC}$ can therefore denote a frequency value of such a superconducting resonator.

In some embodiments, the inductance value L and/or capacitive coupling value C of resonant circuit 306 can be calculated using one or more of equations (1), (2), (4), (5), and/or (6) as described above with reference to FIG. 3B. For example, in some embodiments, resonator definition component 110 can employ resonant circuit component 108 to calculate the inductance value L and/or capacitive coupling value C of resonant circuit 306 using one or more of equations (1), (2), (4), (5), and/or (6) as described above with reference to FIG. 3B.

In some embodiments, resonator definition component 110 can define a frequency value of a superconducting resonator based on resonant circuit 402, where resonant circuit 402 can comprise an electrical circuit representation of such a superconducting resonator. For example, to define such a frequency value of such a superconducting resonator based on resonant circuit 402, resonator definition component 110 can calculate a frequency value of resonant circuit 402 using equation (13) defined below.

$$f_{LC} = \frac{1}{2\pi\sqrt{L_T C_T}} \tag{13}$$

where $f_{LC}$ denotes a frequency value of resonant circuit 402 and as resonant circuit 402 can comprise an electrical circuit representation of a superconducting resonator, $f_{LC}$ can therefore denote a frequency value of such a superconducting resonator.

In some embodiments, the total inductance value $L_T$ and/or total capacitive coupling value $C_T$ of resonant circuit 402 can be calculated using one or more of equations (7), (8), (9), (10), and/or (11) as described above with reference to FIGS. 2 and 4. For example, in some embodiments, resonator definition component 110 can employ resonant circuit component 108 to calculate the total inductance value $L_T$ and/or total capacitive coupling value $C_T$ of resonant circuit 402 using one or more of equations (7), (8), (9), and/or (10) as described above with reference to FIG. 4. In this example, resonator definition component 110 can employ circuit effect component 202 to calculate kinetic inductance value $L_{kin}$ using equation (11) as described above with reference to FIG. 2.

In some embodiments, resonant circuit component 108 can derive a resonant circuit based on one or more attributes of a superconducting circuit comprising the resonant circuit and resonator definition component 110 can define one or more parameters of a superconducting resonator based on the resonant circuit. In these embodiments, resonator definition component 110 can therefore define such one or more parameters of the superconducting resonator based on such one or more attributes of the superconducting circuit. For example, resonator definition component 110 can define one or more parameters (e.g., frequency value, length value, etc.) of a superconducting resonator (e.g., transmission line 302) based on one or more attributes of a superconducting circuit (e.g., circuit 300a, 300b, 400, etc.) comprising the superconducting resonator such as, for instance, a kinetic inductance value $L_{kin}$ of a material (e.g., a dielectric substrate, a metal, a superconducting metal, etc.) that can be used to fabricate the superconducting resonator and/or one or more capacitive coupling values of one or more qubits of the superconducting circuit (e.g., capacitive coupling values of capacitors $C_{g1}$, $C_{g2}$, $C_{p1}$, and $C_{p2}$ described above with reference to FIGS. 3A, 3B, and 4). For instance, as described above with reference to equation (13), resonator definition component 110 can define a frequency value of a superconducting resonator based on resonant circuit 402, where resonant circuit 402 can be derived by resonant circuit component 108 based on attributes of circuit 400 comprising a kinetic inductance value $L_{kin}$ and capacitive coupling values of capacitors $C_{p1}$ and $C_{p2}$.

In some embodiments, resonator definition component 110 can define a frequency value of a superconducting resonator by applying an empirical correction to the frequency value $f_{LC}$ that can be calculated as described above using equation (13), where such empirical correction can account for a change in the frequency value $f_{LC}$ caused by the capacitive coupling values of capacitors $C_{g1}$ and $C_{g2}$. For example, based on the frequency value $f_{LC}$ calculated above using equation (13), resonator definition component 110 can calculate an empirical correction value using equation (14) or (15) defined below.

In some embodiments, for example, where a length value l of a superconducting resonator (e.g., transmission line 302) is defined by an entity (e.g., a human using a GUI of resonator definition system 102 as described above), resonator definition component 110 can employ equations (7), (9), and (13) defined above and equation (14) defined below to calculate such an empirical correction value. In some embodiments, for example, where a frequency value f of a superconducting resonator (e.g., transmission line 302) is defined by an entity (e.g., a human using a GUI of resonator definition system 102 as described above), resonator definition component 110 can employ equations (8), (10), and (13) defined above and equation (15) defined below to calculate such an empirical correction value.

$$\Delta f_{LC} \sim -Z_0(C_{g1}+C_{g2})f_{LC}^2 \quad (14)$$

$$\Delta f_{LC} \sim Z_0(C_{g1}+C_{g2})f_{LC}^2 \quad (15)$$

where:

$\Delta f_{LC}$ denotes an empirical correction value comprising a change in the frequency value $f_{LC}$ caused by the capacitive coupling values of capacitors $C_{g1}$ and $C_{g2}$; and $C_{g1}$ and $C_{g2}$ denote the capacitive coupling values of capacitors $C_{g1}$ and $C_{g2}$ that can represent two (2) qubits capacitively coupled to resonant circuit 402.

In some embodiments, such capacitive coupling values of capacitors $C_{g1}$ and $C_{g2}$ can be predetermined and/or input to resonator definition system 102. For example, such capacitive coupling values of capacitors $C_{g1}$ and $C_{g2}$ can be predetermined by simulating such qubits and/or superconducting circuit using a simulation component (e.g., a simulation application such as, for instance, electromagnetic simulation software, an electromagnetic field solver application, etc.) of, for instance, resonator definition system 102 (not illustrated in the figures). In another example, such capacitive coupling values of capacitors $C_{g1}$ and $C_{g2}$ can be input to resonator definition system 102 by an entity (e.g., a human using a GUI of resonator definition system 102 as described above).

In some embodiments, resonator definition component 110 can define a frequency value of a superconducting resonator based on the frequency value $f_{LC}$ calculated above using equation (13) and the empirical correction value $\Delta f_{LC}$ calculated above using equation (14) or (15). For example, resonator definition component 110 can define a frequency value of a superconducting resonator by mathematically combining (e.g., summing, adding, etc.) the frequency value $f_{LC}$ and the empirical correction value $\Delta f_{LC}$.

In some embodiments, resonator definition component 110, can calculate a corrected length value of a superconducting resonator based on the frequency value $f_{LC}$ calculated above using equation (13) and the empirical correction value $\Delta f_{LC}$ calculated above using equation (14) or (15). For example, resonator definition component 110, can calculate a corrected length value of a superconducting resonator based on the frequency value $f_{LC}$ and the empirical correction value $\Delta f_{LC}$ using equation (16) defined below.

$$l_{\lambda/2} = \frac{c}{2(f_{LC} - \Delta f_{LC})\sqrt{\epsilon_{\mathit{reff}}}} \quad (16)$$

where $l_{\lambda/2}$ denotes a corrected length value of a superconducting resonator that accounts for the kinetic inductance value $L_{kin}$, the capacitive coupling values of $C_{p1}$ and $C_{p2}$, and the empirical correction value $\Delta f_{LC}$ described above with reference to FIGS. 1, 2, 3A, 3B, and 4.

Figure 5:
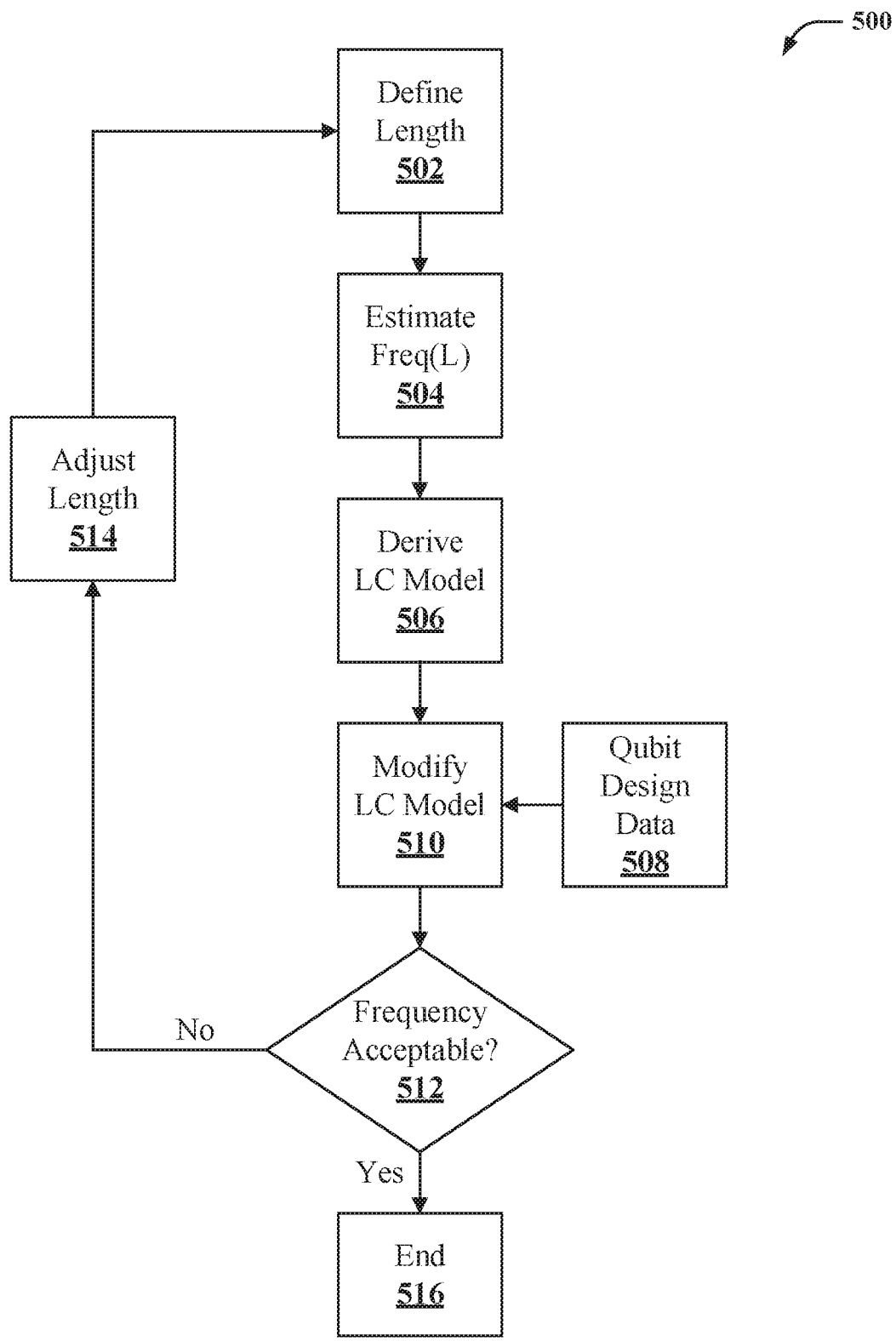
FIG. 5 illustrates a flow diagram of an example, non-limiting computer-implemented method that can facilitate superconducting resonator definition based on one or more superconducting circuit attributes in accordance with one or more embodiments described herein.

FIG. 5 illustrates a flow diagram of an example, non-limiting computer-implemented method 500 that can facilitate superconducting resonator definition based on one or more superconducting circuit attributes in accordance with one or more embodiments described herein. Repetitive description of like elements and/or processes employed in respective embodiments is omitted for sake of brevity.

In some embodiments, resonator definition system 102 (e.g., resonant circuit component 108, resonator definition component 110, circuit effect component 202, etc.) can execute computer-implemented method 500 to define a frequency value of a superconducting resonator that accounts for the kinetic inductance value $L_{kin}$, the capacitive coupling values of $C_{p1}$ and $C_{p2}$, and the empirical correction value $\Delta f_{LC}$ described above with reference to FIGS. 1, 2, 3A, 3B, and 4. In some embodiments, computer-implemented method 500 can comprise an iterative computer-implemented method that can facilitate defining such a frequency value of a superconducting resonator based on a defined length value (e.g., an initial and/or assumed length value) of the superconducting resonator, where such a defined length value can be adjusted iteratively to obtain a desired frequency value (e.g., a predefined frequency value).

In some embodiments, at 502, computer-implemented method 500 can comprise defining, by a system (e.g., via resonator definition system 102, resonant circuit component 108, a GUI of resonator definition system 102, etc.) operatively coupled to a processor (e.g., processor 106), a length value of a superconducting resonator. For example, an entity (e.g., a human using a GUI of resonator definition system 102 as described above) can input such a defined length value (e.g., an initial and/or assumed length value) of a superconducting resonator (e.g., transmission line 302, a superconducting resonator represented by resonant circuit 306, a superconducting resonator represented by resonant circuit 402, etc.).

In some embodiments, at 504, computer-implemented method 500 can comprise estimating (e.g., calculating), by the system (e.g., via resonator definition system 102 and/or resonant circuit component 108), a frequency value of a superconducting resonator based on the defined length value (e.g., a frequency value of a superconducting resonator such as, for instance, transmission line 302, a superconducting resonator represented by resonant circuit 306, a superconducting resonator represented by resonant circuit 402, etc.). For example, resonator definition system 102 and/or resonant circuit component 108 can estimate (e.g., calculate) such a frequency value (e.g., frequency value $f_{\lambda/2}$) using equation (4) as described above with reference to FIGS. 3A and 3B.

In some embodiments, at 506, computer-implemented method 500 can comprise deriving (e.g., generating), by the system (e.g., via resonator definition system 102 and/or resonant circuit component 108), an LC model (e.g., resonant circuit 306). For example, by employing equations (5) and (6) described above with reference to FIGS. 3A and 3B, resonant circuit component 108 can derive (e.g., generate) an LC model (e.g., a quantum inductor capacitor circuit) such as, for instance, resonant circuit 306 based on the frequency value (e.g., frequency value $f_{\lambda/2}$) calculated at 504 described above.

In some embodiments, at 508, computer-implemented method 500 can comprise receiving, by the system (e.g., via resonator definition system 102, resonant circuit component 108, a GUI of resonator definition system 102, etc.), qubit design data. For example, resonator definition system 102 (e.g., via a GUI of resonator definition system 102) and/or resonant circuit component 108 can receive capacitive coupling values of capacitors $C_{p1}$, $C_{p2}$, $C_{g1}$, and/or $C_{g2}$ defined above, where such capacitive coupling values of capacitors $C_{p1}$, $C_{p2}$, $C_{g1}$, and/or $C_{g2}$ can be predetermined by simulation of qubits represented by such capacitors and/or a superconducting circuit comprising such qubits as described above.

In some embodiments, at 510, computer-implemented method 500 can comprise modifying (e.g., updating), by the system (e.g., via resonator definition system 102, resonant circuit component 108, resonator definition component 110, and/or circuit effect component 202), the LC model. For example, resonator definition system 102 (e.g., via resonant circuit component 108, resonator definition component 110, and circuit effect component 202) can modify resonant circuit 306 (e.g., a frequency value of resonant circuit 306) to account for the kinetic inductance value $L_{kin}$ defined above with reference to FIG. 4 and/or the capacitive coupling values of capacitors $C_{p1}$ and/or $C_{p2}$. In another example, resonator definition system 102 (e.g., via resonant circuit component 108, resonator definition component 110, and circuit effect component 202) can modify resonant circuit 306 and/or resonant circuit 402 (e.g., a frequency value of resonant circuit 306 and/or resonant circuit 402) to account for the capacitive coupling values of capacitors $C_{g1}$ and/or $C_{g2}$.

In some embodiments, resonator definition system 102 (e.g., via resonant circuit component 108, resonator definition component 110, and circuit effect component 202) can modify (e.g., update) resonant circuit 306 (e.g., a frequency value of resonant circuit 306) to account for the kinetic inductance value $L_{kin}$ by calculating the total inductance value $L_T$ using equation (9) defined above and the kinetic inductance value $L_{kin}$ using equation (11) defined above (e.g., using circuit effect component 202). In these embodiments, resonator definition system 102 (e.g., via resonant circuit component 108, resonator definition component 110, and circuit effect component 202) can further modify resonant circuit 306 (e.g., a frequency value of resonant circuit 306) to account for the capacitive coupling values of capacitors $C_{p1}$ and/or $C_{p2}$ by calculating total capacitive coupling value $C_T$ using equation (7) defined above.

In these embodiments, by calculating the total inductance value $L_T$ and the total capacitive coupling value $C_T$, resonator definition system 102 (e.g., via resonant circuit component 108, resonator definition component 110, and circuit effect component 202) can thereby derive resonant circuit 402, where resonant circuit 402 can comprise a frequency value $f_{LC}$ that can be based on such total inductance value $L_T$ and total capacitive coupling value $C_T$. In these embodiments, resonator definition system 102 (e.g., via resonant circuit component 108, resonator definition component 110, and circuit effect component 202) can calculate such a frequency value $f_{LC}$ using equation (13) defined above. In these embodiments, resonator definition system 102 (e.g., via resonant circuit component 108, resonator definition component 110, and circuit effect component 202) can modify (e.g., update) resonant circuit 402 (e.g., modify the frequency value $f_{LC}$ of resonant circuit 402) to account for the capacitive coupling values of capacitors $C_{g1}$ and/or $C_{g2}$ by calculating the empirical correction value $\Delta'f_{LC}$ using equation (14) defined above. In these embodiments, resonator definition system 102 (e.g., via resonant circuit component 108, resonator definition component 110, and circuit effect component 202) can modify frequency value $f_{LC}$ of resonant circuit 402 to account for the empirical correction value $\Delta f_{LC}$ by mathematically combining (e.g., summing, adding, etc.) the empirical correction value $\Delta f_{LC}$ and the frequency value $f_{LC}$.

In some embodiments, at 512, computer-implemented method 500 can comprise determining, by the system (e.g., via resonator definition system 102, resonant circuit component 108, resonator definition component 110, circuit effect component 202, etc.), whether the modified frequency value $f_{LC}$ of resonant circuit 402 calculated at 510 above is acceptable. For example, resonator definition system 102 (e.g., via resonant circuit component 108, resonator definition component 110, circuit effect component 202, etc.) can determine whether the modified frequency value $f_{LC}$ of resonant circuit 402 calculated at 510 above is within a defined numerical range (e.g., within a range of approximately 1 megahertz (MHz) to approximately 15 MHz) of a defined frequency value of a qubit (e.g., 5 gigahertz (GHz), 10 GHz, etc.) that can be capacitively coupled to resonant circuit 402.

In some embodiments, if the system (e.g., resonator definition system 102, resonant circuit component 108, resonator definition component 110, circuit effect component 202, etc.) determines at 512 that the modified frequency value $f_{LC}$ of resonant circuit 402 is not acceptable, at 514, computer-implemented method 500 can comprise adjusting, by the system (e.g., via resonator definition system 102, resonant circuit component 108, a GUI of resonator definition system 102, etc.) the length value of the superconducting resonator defined at 502 above. In these embodiments, based on the adjusted length value of the superconducting resonator adjusted at 514 above, the system (e.g., resonator definition system 102, resonant circuit component 108, resonator definition component 110, circuit effect component 202, etc.) can repeat, as needed, operations 502 to 514 of computer-implemented method 500 to obtain a modified frequency value $f_{LC}$ of resonant circuit 402 that is acceptable (e.g., within a defined numerical range of a defined frequency of a qubit). In these embodiments, such an acceptable modified frequency value $f_{LC}$ of resonant circuit 402 can thereby comprise a frequency value of a superconducting resonator that accounts for the kinetic inductance value $L_{kin}$, the capacitive coupling values of $C_{p1}$ and $C_{p2}$, and the empirical correction value $\Delta f_{LC}$ described above with reference to FIGS. 1, 2, 3A, 3B, and 4.

In some embodiments, if the system (e.g., resonator definition system 102, resonant circuit component 108, resonator definition component 110, circuit effect component 202, etc.) determines at 512 that the modified frequency value $f_{LC}$ of resonant circuit 402 is acceptable, at 516, computer-implemented method 500 can comprise ending, by the system (e.g., via resonator definition system 102, resonant circuit component 108, resonator definition component 110, circuit effect component 202, etc.) computer-implemented method 500.

Figure 6:
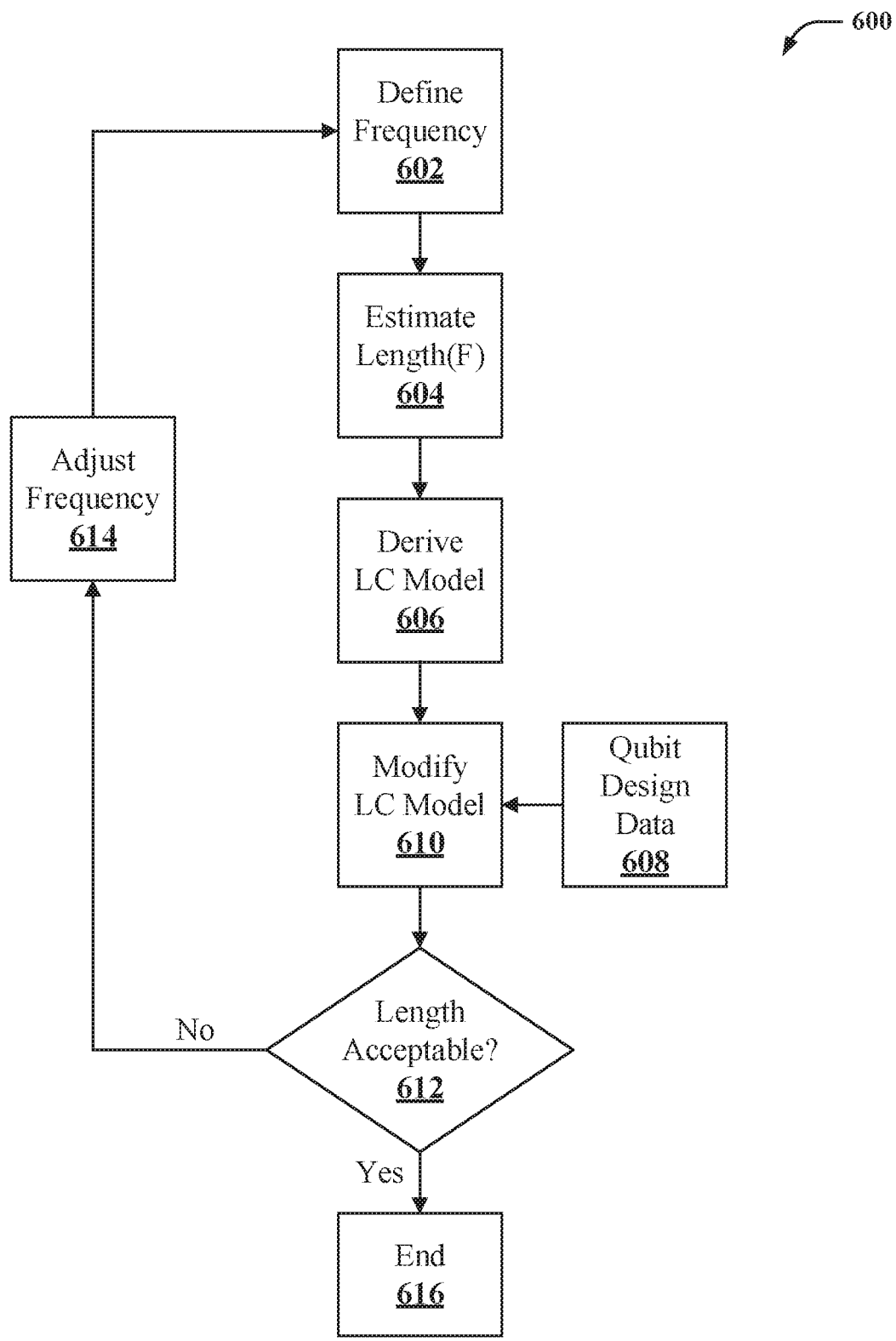
FIG. 6 illustrates a flow diagram of an example, non-limiting computer-implemented method that can facilitate superconducting resonator definition based on one or more superconducting circuit attributes in accordance with one or more embodiments described herein.

FIG. 6 illustrates a flow diagram of an example, non-limiting computer-implemented method 600 that can facilitate a superconducting resonator definition process based on one or more superconducting circuit attributes in accordance with one or more embodiments described herein. Repetitive description of like elements and/or processes employed in respective embodiments is omitted for sake of brevity.

In some embodiments, resonator definition system 102 (e.g., resonant circuit component 108, resonator definition component 110, circuit effect component 202, etc.) can execute computer-implemented method 600 to define a length value of a superconducting resonator that accounts for the kinetic inductance value $L_{kin}$, the capacitive coupling values of $C_{p1}$ and $C_{p2}$, and the empirical correction value $\Delta f_{LC}$ described above with reference to FIGS. 1, 2, 3A, 3B, and 4. In some embodiments, computer-implemented method 600 can comprise an iterative computer-implemented method that can facilitate defining such a length value of a superconducting resonator based on a defined frequency value (e.g., an initial, assumed, and/or desired frequency value) of the superconducting resonator, where such a defined frequency value can be adjusted iteratively to obtain a desired length value (e.g., a predefined length value).

In some embodiments, at 602, computer-implemented method 600 can comprise defining, by a system (e.g., via resonator definition system 102, resonant circuit component 108, a GUI of resonator definition system 102, etc.) operatively coupled to a processor (e.g., processor 106), a frequency of a superconducting resonator. For example, an entity (e.g., a human using a GUI of resonator definition system 102 as described above) can input such a defined frequency value (e.g., an initial, assumed, and/or desired frequency value) of a superconducting resonator (e.g., transmission line 302, a superconducting resonator represented by resonant circuit 306, a superconducting resonator represented by resonant circuit 402, etc.).

In some embodiments, at 604, computer-implemented method 600 can comprise estimating (e.g., calculating), by the system (e.g., via resonator definition system 102 and/or resonant circuit component 108), a length value of a superconducting resonator based on the defined frequency value (e.g., a length value of a superconducting resonator such as, for instance, transmission line 302, a superconducting resonator represented by resonant circuit 306, a superconducting resonator represented by resonant circuit 402, etc.). For example, resonator definition system 102 and/or resonant circuit component 108 can estimate (e.g., calculate) such a length value (e.g., length value l) using equation (3) as described above with reference to FIGS. 3A and 3B.

In some embodiments, at 606, computer-implemented method 600 can comprise deriving (e.g., generating), by the system (e.g., via resonator definition system 102 and/or resonant circuit component 108), an LC model (e.g., resonant circuit 306). For example, by employing equations (1) and (2) described above with reference to FIGS. 3A and 3B, resonant circuit component 108 can derive (e.g., generate) an LC model (e.g., a quantum inductor capacitor circuit) such as, for instance, resonant circuit 306 based on the frequency value defined at 602 above and/or the length value (e.g., length value l) calculated at 604 described above.

In some embodiments, at 608, computer-implemented method 600 can comprise receiving, by the system (e.g., via resonator definition system 102, resonant circuit component 108, a GUI of resonator definition system 102, etc.), qubit design data. For example, resonator definition system 102 (e.g., via a GUI of resonator definition system 102) and/or resonant circuit component 108 can receive capacitive coupling values of capacitors $C_{p1}$, $C_{p2}$, $C_{g1}$, and/or $C_{g2}$ defined above, where such capacitive coupling values of capacitors $C_{p1}$, $C_{p2}$, $C_{g1}$, and/or $C_{g2}$ can be predetermined by simulation of qubits represented by such capacitors and/or a superconducting circuit comprising such qubits as described above.

In some embodiments, at 610, computer-implemented method 600 can comprise modifying (e.g., updating), by the system (e.g., via resonator definition system 102, resonant circuit component 108, resonator definition component 110, and/or circuit effect component 202), the LC model. For example, resonator definition system 102 (e.g., via resonant circuit component 108, resonator definition component 110, and circuit effect component 202) can modify resonant circuit 306 (e.g., a frequency value of resonant circuit 306) to account for the kinetic inductance value $L_{kin}$ defined above with reference to FIG. 4 and/or the capacitive coupling values of capacitors $C_{p1}$ and/or $C_{p2}$. In another example, resonator definition system 102 (e.g., via resonant circuit component 108, resonator definition component 110, and circuit effect component 202) can modify resonant circuit 306 and/or resonant circuit 402 (e.g., a frequency value of resonant circuit 306 and/or resonant circuit 402) to account for the capacitive coupling values of capacitors $C_{g1}$ and/or $C_{g2}$.

In some embodiments, resonator definition system 102 (e.g., via resonant circuit component 108, resonator definition component 110, and circuit effect component 202) can modify (e.g., update) resonant circuit 306 (e.g., a frequency value of resonant circuit 306) to account for the kinetic inductance value $L_{kin}$ by calculating the total inductance value $L_T$ using equation (10) defined above and the kinetic inductance value $L_{kin}$ using equation (11) defined above (e.g., using circuit effect component 202). In these embodiments, resonator definition system 102 (e.g., via resonant circuit component 108, resonator definition component 110, and circuit effect component 202) can further modify resonant circuit 306 (e.g., a frequency value of resonant circuit 306) to account for the capacitive coupling values of capacitors $C_{p1}$ and/or $C_{p2}$ by calculating total capacitive coupling value $C_T$ using equation (8) defined above.

In these embodiments, by calculating the total inductance value $L_T$ and the total capacitive coupling value $C_T$, resonator definition system 102 (e.g., via resonant circuit component 108, resonator definition component 110, and circuit effect component 202) can thereby derive resonant circuit 402, where resonant circuit 402 can comprise a frequency value $f_{LC}$ that can be based on such total inductance value $L_T$ and total capacitive coupling value $C_T$. In these embodiments, resonator definition system 102 (e.g., via resonant circuit component 108, resonator definition component 110, and circuit effect component 202) can calculate such a frequency value $f_{LC}$ using equation (13) defined above. In these embodiments, resonator definition system 102 (e.g., via resonant circuit component 108, resonator definition component 110, and circuit effect component 202) can modify (e.g., update) resonant circuit 402 (e.g., modify the frequency value $f_{LC}$ of resonant circuit 402) to account for the capacitive coupling values of capacitors $C_{g1}$ and/or $C_{g2}$ by calculating the empirical correction value $\Delta f_{LC}$ using equation (15) defined above. In these embodiments, resonator definition system 102 (e.g., via resonant circuit component 108, resonator definition component 110, and circuit effect component 202) can modify frequency value $f_{LC}$ of resonant circuit 402 to account for the empirical correction value $\Delta f_{LC}$ by mathematically combining (e.g., summing, adding, etc.) the empirical correction value $\Delta f_{LC}$ and the frequency value $f_{LC}$.

In some embodiments, at 612, computer-implemented method 600 can comprise determining, by the system (e.g., via resonator definition system 102, resonant circuit component 108, resonator definition component 110, circuit effect component 202, etc.), whether a length value of a superconducting resonator represented by resonant circuit 402 is acceptable, where such a length value can correspond to the modified frequency value $f_{LC}$ of resonant circuit 402 calculated at 610 above. For example, resonator definition system 102 (e.g., via resonant circuit component 108, resonator definition component 110, circuit effect component 202, etc.) can determine whether the modified frequency value $f_{LC}$ of resonant circuit 402 calculated at 610 above is within a defined numerical range (e.g., within a range of approximately 1 MHz to approximately 15 MHz range) of a defined frequency value of a qubit (e.g., 5 GHz, 10 GHz, etc.) that can be capacitively coupled to resonant circuit 402. In this example, if resonator definition system 102 (e.g., via resonant circuit component 108, resonator definition component 110, circuit effect component 202, etc.) determines the modified frequency value $f_{LC}$ of resonant circuit 402 calculated at 610 above is within such a defined numerical range, resonator definition system 102 (e.g., via resonant circuit component 108, resonator definition component 110, circuit effect component 202, etc.) can thereby determine that the length value of a superconducting resonator represented by resonant circuit 402 is also acceptable.

In some embodiments, if the system (e.g., resonator definition system 102, resonant circuit component 108, resonator definition component 110, circuit effect component 202, etc.) determines at 612 that the modified frequency value $f_{LC}$ of resonant circuit 402 is not acceptable and therefore the corresponding length value is also not acceptable, at 614, computer-implemented method 600 can comprise adjusting, by the system (e.g., via resonator definition system 102, resonant circuit component 108, a GUI of resonator definition system 102, etc.) the frequency value of the superconducting resonator defined at 602 above. In these embodiments, based on the adjusted frequency value of the superconducting resonator adjusted at 614 above, the system (e.g., resonator definition system 102, resonant circuit component 108, resonator definition component 110, circuit effect component 202, etc.) can repeat, as needed, operations 602 to 614 of computer-implemented method 600 to obtain a modified frequency value $f_{LC}$ of resonant circuit 402, and a corresponding length value, that is acceptable (e.g., a modified frequency value $f_{LC}$ that is within a defined numerical range of a defined frequency of a qubit). In these embodiments, such an acceptable modified frequency value $f_{LC}$ of resonant circuit 402, and corresponding length value, can thereby comprise a frequency value and a length value of a superconducting resonator that account for the kinetic inductance value $L_{kin}$, the capacitive coupling values of $C_{p1}$ and $C_{p2}$, and the empirical correction value $\Delta f_{LC}$ described above with reference to FIGS. 1, 2, 3A, 3B, and 4.

In some embodiments, if the system (e.g., resonator definition system 102, resonant circuit component 108, resonator definition component 110, circuit effect component 202, etc.) determines at 612 that the modified frequency value $f_{LC}$ of resonant circuit 402 is not acceptable and therefore the corresponding length value is also not acceptable, resonator definition system 102 (e.g., via resonant circuit component 108, resonator definition component 110, circuit effect component 202, etc.), can calculate a corrected length value $l_{\lambda/2}$ of a superconducting resonator using equation (16) defined above. For example, using equation (16) defined above, resonator definition system 102 (e.g., via resonant circuit component 108, resonator definition component 110, circuit effect component 202, etc.), can calculate a corrected length value $l_{\lambda/2}$ of a superconducting resonator based on the frequency value $f_{LC}$ calculated above using equation (13) and the empirical correction value $\Delta f_{LC}$ calculated above using equation (14) or (15). In this example, resonator definition system 102 (e.g., via resonant circuit component 108, resonator definition component 110, circuit effect component 202, etc.), can calculate a corrected length value $l_{\lambda/2}$ of a superconducting resonator that accounts for the kinetic inductance value $L_{kin}$, the capacitive coupling values of $C_{p1}$ and $C_{p2}$, and the empirical correction value $\Delta f_{LC}$ described above with reference to FIGS. 1, 2, 3A, 3B, and 4.

In some embodiments, if the system (e.g., resonator definition system 102, resonant circuit component 108, resonator definition component 110, circuit effect component 202, etc.) determines at 612 that the modified frequency value $f_{LC}$ of resonant circuit 402, and therefore the corresponding length value, is acceptable, at 616, computer-implemented method 600 can comprise ending, by the system (e.g., via resonator definition system 102, resonant circuit component 108, resonator definition component 110, circuit effect component 202, etc.) computer-implemented method 600.

FIG. 7 illustrates an example, non-limiting table 700 that can facilitate superconducting resonator definition based on one or more superconducting circuit attributes in accordance with one or more embodiments described herein. Repetitive description of like elements and/or processes employed in respective embodiments is omitted for sake of brevity.

According to multiple embodiments, table 700 can comprise a column 702 comprising superconducting resonator identification numbers (e.g., 1, 2, 3, 4, etc.) of superconducting resonators that have been tested to measure frequency values of each superconducting resonator. In some embodiments, table 700 can comprise a column 704 comprising actual (e.g., real) measured frequency values (e.g., expressed in units of gigahertz (GHz)) of fabricated superconducting resonators that have been physically measured.

In some embodiments, table 700 can comprise a column 706 comprising frequency error values (e.g., plus or minus (+/−) frequency values expressed in units of megahertz (MHz)) of simulated superconducting resonators that have been measured using a simulation component (e.g., a simulation application such as, for instance, electromagnetic simulation software, an electromagnetic field solver application, etc.) of, for instance, resonator definition system 102 (not illustrated in the figures). In these embodiments, such simulated superconducting resonators can be simulated based on the same parameters (e.g., length, material, etc.) used to fabricate the superconducting resonators of column 702. In some embodiments, column 706 can comprise frequency error values indicative of a difference in frequency values of fabricated superconducting resonators that have been physically measured (e.g., measured frequency values of column 704) and frequency values of simulated superconducting resonators that have been simulated and/or measured based on the same parameters (e.g., length, material, etc.) used to fabricate the superconducting resonators of column 702.

In some embodiments, table 700 can comprise a column 708 comprising frequency error values (e.g., plus or minus (+/−) frequency values expressed in units of megahertz (MHz)) of superconducting resonators modeled as discrete resonant circuits (e.g., discrete resonant circuits 402) that have been derived in accordance with one or more embodiments described herein, where each of such resonant circuits have a frequency value corresponding thereto (e.g., the modified frequency value $f_{LC}$ of resonant circuit 402 described above). In these embodiments, such discrete resonant circuits (e.g., discrete resonant circuits 402) can be derived in accordance with one or more embodiments described herein based on the same parameters (e.g., length, material, etc.) used to fabricate the superconducting resonators of column 702. In some embodiments, column 708 can comprise frequency error values indicative of a difference in frequency values of fabricated superconducting resonators that have been physically measured (e.g., measured frequency values of column 704) and frequency values of resonant circuits (e.g., modified frequency values fix of discrete resonant circuits 402) that have been derived in accordance with one or more embodiments described herein based on the same parameters (e.g., length, material, etc.) used to fabricate the superconducting resonators of column 702.

In some embodiments, resonator definition system 102 can be associated with various technologies. For example, resonator definition system 102 can be associated with classical computing technologies, quantum computing technologies, superconducting circuit technologies, superconducting circuit simulation technologies, inductor capacitor circuit technologies, quantum inductor capacitor circuit technologies, resonator technologies, superconducting resonator technologies, and/or other technologies.

In some embodiments, resonator definition system 102 can provide technical improvements to systems, devices, components, operational steps, and/or processing steps associated with the various technologies identified above. For example, resonator definition system 102 can: derive a resonant circuit indicative of a superconducting resonator of a superconducting circuit based on one or more attributes of the superconducting circuit; and/or define a frequency value of the superconducting resonator based on the resonant circuit. In this example, resonator definition system 102 can thereby facilitate: improved accuracy of the frequency value (e.g., the modified frequency value $f_{LC}$ of resonant circuit 402 derived as described above); and/or improved performance of the superconducting circuit due to such improved accuracy of the frequency value.

In this example, resonator definition system 102 can thereby reduce the time and effort needed to design and/or simulate one or more superconducting resonators with proper accuracy, which can facilitate improved performance of a processing unit (e.g., processor 106) by reducing processing time and/or processing workload of such a processing unit.

In some embodiments, resonator definition system 102 can provide technical improvements to a processing unit (e.g., processor 106) associated with a classical computing device and/or a quantum computing device (e.g., a quantum processor, quantum hardware, superconducting circuit, etc.). For example, by deriving a resonant circuit indicative of a superconducting resonator of a superconducting circuit based on one or more attributes of the superconducting circuit and/or defining a frequency value of the superconducting resonator based on the resonant circuit, resonator definition system 102 can thereby reduce the time and effort (e.g., human effort, computational effort and/or cost, etc.) needed to design and/or simulate one or more superconducting resonators with proper accuracy. In this example, by reducing the time and effort needed to design and/or simulate one or more superconducting resonators with proper accuracy, resonator definition system 102 can thereby facilitate improved performance of a processing unit (e.g., processor 106) associated with resonator definition system 102 by reducing processing time and/or processing workload of such a processing unit.

In some embodiments, resonator definition system 102 can employ hardware or software to solve problems that are highly technical in nature, that are not abstract and that cannot be performed as a set of mental acts by a human In some embodiments, some of the processes described herein may be performed by one or more specialized computers (e.g., one or more specialized processing units, a specialized quantum computer, etc.) for carrying out defined tasks related to the various technologies identified above. In some embodiments, resonator definition system 102 and/or components thereof, can be employed to solve new problems that arise through advancements in technologies mentioned above, employment of quantum computing systems, cloud computing systems, computer architecture, and/or another technology.

It is to be appreciated that resonator definition system 102 can utilize various combinations of electrical components, mechanical components, and circuitry that cannot be replicated in the mind of a human or performed by a human, as the various operations that can be executed by resonator definition system 102 and/or components thereof as described herein are operations that are greater than the capability of a human mind. For instance, the amount of data processed, the speed of processing such data, or the types of data processed by resonator definition system 102 over a certain period of time can be greater, faster, or different than the amount, speed, or data type that can be processed by a human mind over the same period of time.

According to several embodiments, resonator definition system 102 can also be fully operational towards performing one or more other functions (e.g., fully powered on, fully executed, etc.) while also performing the various operations described herein. It should be appreciated that such simultaneous multi-operational execution is beyond the capability of a human mind. It should also be appreciated that resonator definition system 102 can include information that is impossible to obtain manually by an entity, such as a human user. For example, the type, amount, or variety of information included in resonator definition system 102, resonant circuit component 108, resonator definition component 110, and/or circuit effect component 202 can be more complex than information obtained manually by a human user.

Figure 8:
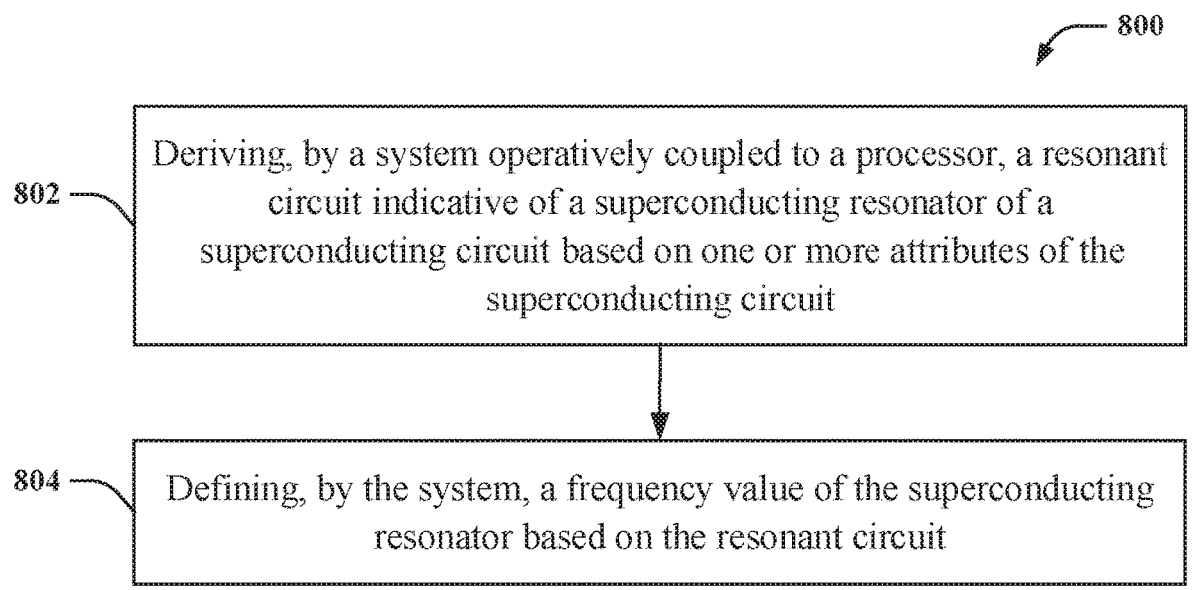
FIG. 8 illustrates a flow diagram of an example, non-limiting computer-implemented method that can facilitate superconducting resonator definition based on one or more superconducting circuit attributes in accordance with one or more embodiments described herein.

FIG. 8 illustrates a flow diagram of an example, non-limiting computer-implemented method 800 that can facilitate superconducting resonator definition based on one or more superconducting circuit attributes in accordance with one or more embodiments described herein. Repetitive description of like elements and/or processes employed in respective embodiments is omitted for sake of brevity.

In some embodiments, at 802, computer-implemented method 800 can comprise deriving, by a system (e.g., via resonator definition system 102, resonant circuit component 108, resonator definition component 110, circuit effect component 202, etc.) operatively coupled to a processor (e.g., processor 106), a resonant circuit (e.g., resonant circuit 402) indicative of a superconducting resonator (e.g., a single mode superconducting resonator modeled as resonant circuit 402) of a superconducting circuit (e.g., circuit 400, a circuit QED, etc.) based on one or more attributes of the superconducting circuit (e.g., a kinetic inductance value of the superconducting circuit, capacitive coupling value(s) of one or more qubits of the superconducting circuit).

In some embodiments, at 804, computer-implemented method 800 can comprise defining, by the system (e.g., via resonator definition system 102, resonant circuit component 108, resonator definition component 110, circuit effect component 202, etc.) a frequency value (e.g., the modified frequency value $f_{LC}$ of resonant circuit 402 described above with reference to FIG. 5) of the superconducting resonator based on the resonant circuit.

Figure 9:
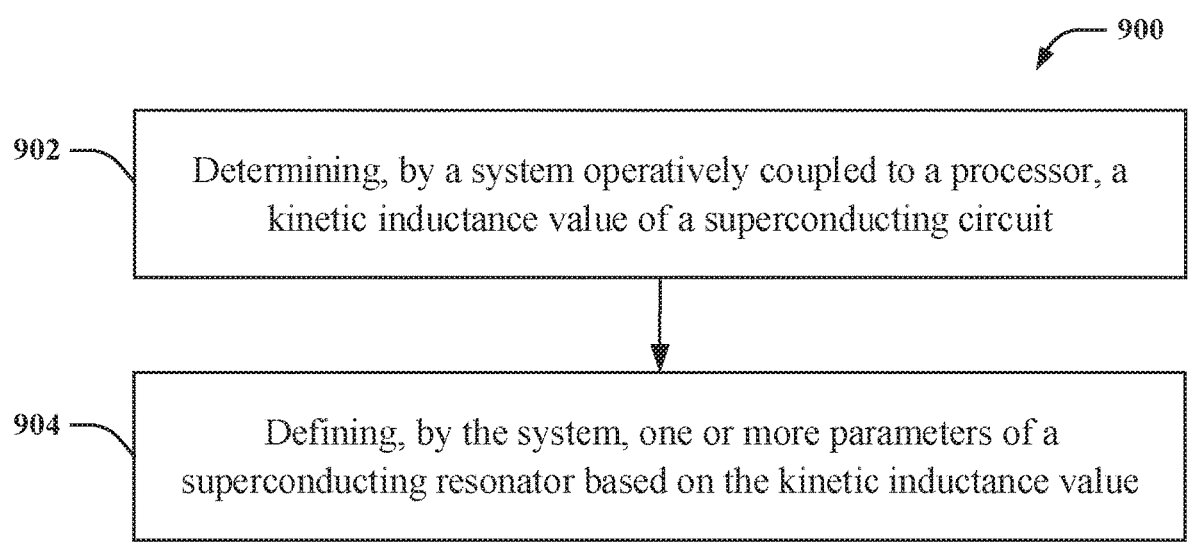
FIG. 9 illustrates a flow diagram of an example, non-limiting computer-implemented method that can facilitate superconducting resonator definition based on one or more superconducting circuit attributes in accordance with one or more embodiments described herein.

FIG. 9 illustrates a flow diagram of an example, non-limiting computer-implemented method 900 that can facilitate superconducting resonator definition based on one or more superconducting circuit attributes in accordance with one or more embodiments described herein. Repetitive description of like elements and/or processes employed in respective embodiments is omitted for sake of brevity.

In some embodiments, at 902, computer-implemented method 900 can comprise determining, by a system (e.g., via resonator definition system 102 and/or circuit effect component 202) operatively coupled to a processor (e.g., processor 106), a kinetic inductance value (e.g., kinetic inductance value $L_{kin}$ described above with reference to FIG. 2) of a superconducting circuit (e.g., circuit 400, a circuit QED, etc.).

In some embodiments, at 904, computer-implemented method 900 can comprise defining, by the system (e.g., via resonator definition system 102, resonant circuit component 108, resonator definition component 110, circuit effect component 202, etc.) one or more parameters (e.g., the modified frequency value $f_{LC}$ and/or the corrected length value $l_{\lambda/2}$ of resonant circuit 402 described above with reference to FIGS. 5 and 6, respectively) of a superconducting resonator (e.g., a single mode superconducting resonator modeled as resonant circuit 402) based on the kinetic inductance value.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
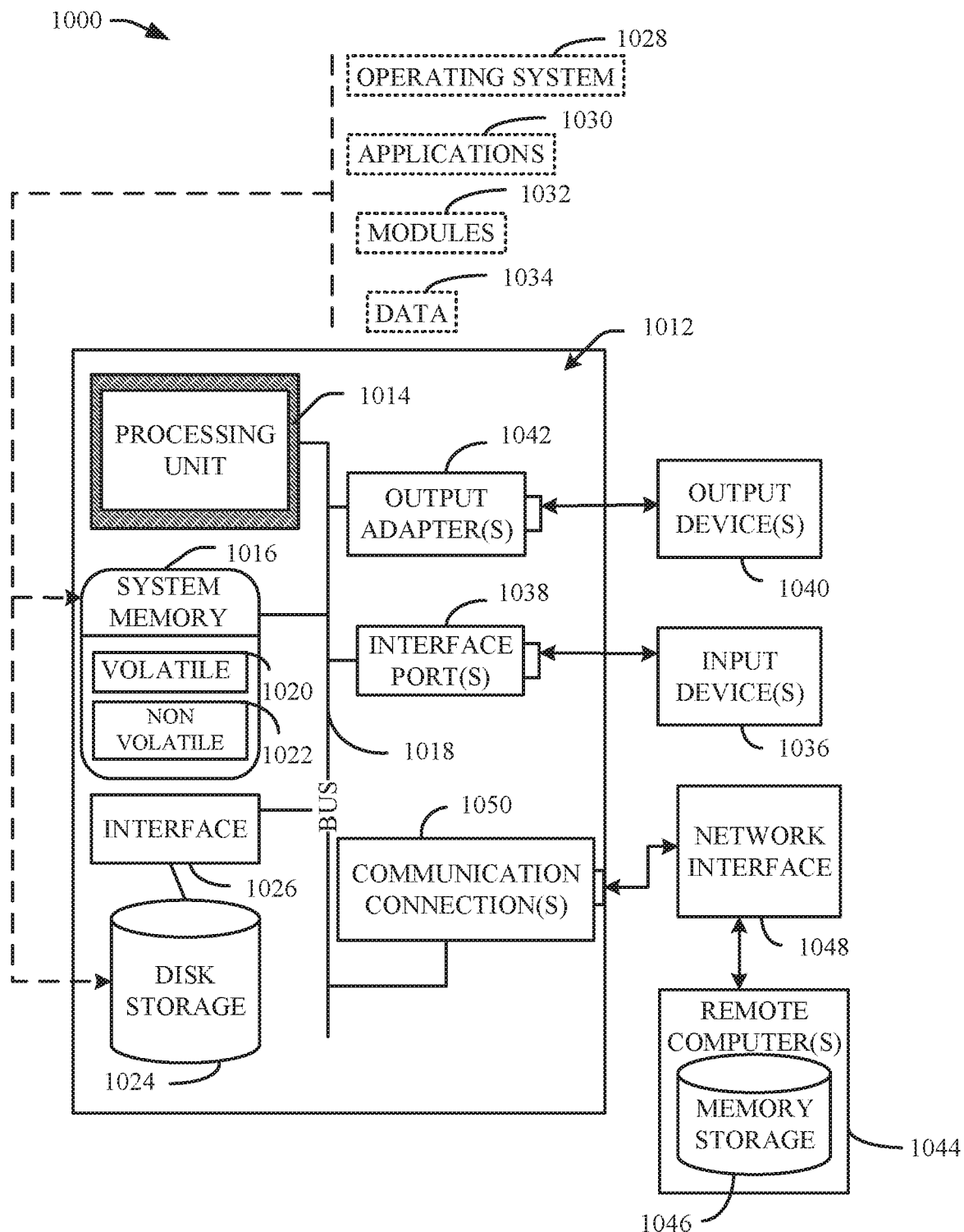
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer executable components; and
   a processor that executes the computer executable components stored in the memory, wherein the computer executable components comprise:
   a resonator definition component that estimates a frequency value of a superconducting resonator of a superconducting circuit based on a length value of the superconducting resonator and an effective dielectric constant of a dielectric substrate of the superconducting resonator; and
   a resonant circuit component that generates a resonant circuit based on the frequency value of the superconducting resonator, wherein the resonant circuit models the superconducting resonator and comprises at least one inductor and at least one capacitor.

2. The system of claim 1, wherein the resonant circuit comprises a quantum inductor capacitor circuit.

3. The system of claim 1, wherein the superconducting resonator comprises a single mode superconducting resonator, a single mode qubit bus resonator, a single mode qubit transmission line resonator, or a single mode transmission line superconducting resonator.

4. The system of claim 1, wherein the resonant circuit component generates the resonant circuit based further on one or more attributes of the superconducting circuit.

5. The system of claim 4, wherein the one or more attributes comprise at least one of a kinetic inductance value of a material of the superconducting circuit or a capacitive coupling value of a qubit capacitively coupled to at least one of the resonant circuit, the superconducting resonator, or a ground, thereby facilitating at least one of improved accuracy of the frequency value, improved performance of the superconducting circuit, or improved performance of the processor.

6. The system of claim 4, wherein the one or more attributes comprise a total capacitive coupling value comprising a capacitive coupling value of the resonant circuit and one or more capacitive coupling values of one or more qubits capacitively coupled to at least one of the resonant circuit, the superconducting resonator, or a ground.

7. The system of claim 4, wherein the one or more attributes comprise a total inductance value comprising an inductance value of the resonant circuit and one or more kinetic inductance values of one or more materials of the superconducting circuit.

8. A computer-implemented method, comprising:
   determining, by a system operatively coupled to a processor, a length value of a superconducting resonator of a superconducting circuit and an effective dielectric constant of a dielectric substrate of the superconducting resonator;
   estimating, by the system, a frequency value of the superconducting resonator based on the length value of the superconducting resonator and the effective dielectric constant of the dielectric substrate; and
   generating, by the system, a resonant circuit based on the frequency value of the superconducting resonator, wherein the resonant circuit models the superconducting resonator and comprises at least one inductor and at least one capacitor.

9. The computer-implemented method of claim 8, wherein the resonant circuit comprises a quantum inductor capacitor circuit.

10. The computer-implemented method of claim 8, wherein the superconducting resonator comprises a single mode superconducting resonator, a single mode qubit bus resonator, a single mode qubit transmission line resonator, or a single mode transmission line superconducting resonator.

11. The computer-implemented method of claim 8, further comprising generating, by the system, the resonant circuit based further on one or more attributes of the superconducting circuit.

12. The computer-implemented method of claim 11, wherein the one or more attributes comprise at least one of a kinetic inductance value of a material of the superconducting circuit or a capacitive coupling value of a qubit capacitively coupled to at least one of the resonant circuit, the superconducting resonator, or a ground, thereby facilitating at least one of improved accuracy of the frequency value, improved performance of the superconducting circuit, or improved performance of the processor.

13. The computer-implemented method of claim 11, wherein the one or more attributes comprise a total capacitive coupling value comprising a capacitive coupling value of the resonant circuit and one or more capacitive coupling values of one or more qubits capacitively coupled to at least one of the resonant circuit, the superconducting resonator, or a ground.

14. The computer-implemented method of claim 11, wherein the one or more attributes comprise a total inductance value comprising an inductance value of the resonant circuit and one or more kinetic inductance values of one or more materials of the superconducting circuit.

15. A computer program product facilitating superconducting resonator definition based on one or more superconducting circuit attributes, the computer program product comprising a computer readable storage medium having program instructions embodied therewith, the program instructions executable by a processor to cause the processor to:
   determine a length value of a superconducting resonator of a superconducting circuit and an effective dielectric constant of a dielectric substrate of the superconducting resonator;
   estimate a frequency value of the superconducting resonator based on the length value of the superconducting resonator and the effective dielectric constant of the dielectric substrate; and
   generate a resonant circuit based on the frequency value of the superconducting resonator, wherein the resonant circuit models the superconducting resonator and comprises at least one inductor and at least one capacitor.

16. The computer program product of claim 15, wherein the superconducting resonator comprises a single mode superconducting resonator, a single mode qubit bus resonator, a single mode qubit transmission line resonator, or a single mode transmission line superconducting resonator.

17. The computer program product of claim 15, wherein the program instructions are further executable by the processor to cause the processor to:
   generate the resonant circuit based further on one or more attributes of the superconducting circuit.

18. The computer program product of claim 17, wherein the one or more attributes comprise at least one of a kinetic inductance value of a material of the superconducting circuit or a capacitive coupling value of a qubit capacitively coupled to at least one of the resonant circuit, the superconducting resonator, or a ground, thereby facilitating at least one of improved accuracy of the frequency value, improved performance of the superconducting circuit, or improved performance of the processor.

19. The computer program product of claim 17, wherein the one or more attributes comprise a total capacitive coupling value comprising a capacitive coupling value of the resonant circuit and one or more capacitive coupling values of one or more qubits capacitively coupled to at least one of the resonant circuit, the superconducting resonator, or a ground.

20. The computer program product of claim 17, wherein the one or more attributes comprise a total inductance value comprising an inductance value of the resonant circuit and one or more kinetic inductance values of one or more materials of the superconducting circuit.

* * * * *